US010553626B2

(12) United States Patent
Sugawa et al.

(10) Patent No.: US 10,553,626 B2
(45) Date of Patent: Feb. 4, 2020

(54) SOLID-STATE LIGHT-RECEIVING DEVICE FOR ULTRAVIOLET LIGHT

(71) Applicant: TOHOKU UNIVERSITY, Sendai, Miyagi (JP)

(72) Inventors: Shigetoshi Sugawa, Sendai (JP); Rihito Kuroda, Sendai (JP)

(73) Assignee: TOHOKU UNIVERSITY, Sendai (JP)

( * ) Notice: Subject to any disclaimer, the term of this patent is extended or adjusted under 35 U.S.C. 154(b) by 381 days.

(21) Appl. No.: 15/307,883

(22) PCT Filed: May 7, 2015

(86) PCT No.: PCT/JP2015/063180
§ 371 (c)(1),
(2) Date: Apr. 3, 2017

(87) PCT Pub. No.: WO2015/170698
PCT Pub. Date: Nov. 12, 2015

(65) Prior Publication Data
US 2017/0207256 A1 Jul. 20, 2017

(30) Foreign Application Priority Data

May 9, 2014 (JP) ................................. 2014-097547

(51) Int. Cl.
H01L 27/144 (2006.01)
H01L 31/103 (2006.01)
(Continued)

(52) U.S. Cl.
CPC .......... H01L 27/1443 (2013.01); G01J 1/429 (2013.01); G01J 1/44 (2013.01); H01L 31/035272 (2013.01); H01L 31/103 (2013.01)

(58) Field of Classification Search
CPC ......... H01L 27/1443; H01L 31/035272; H01L 31/103; H01L 27/144; G01J 1/4228;
(Continued)

(56) References Cited

U.S. PATENT DOCUMENTS

2005/0258501 A1* 11/2005 Natsuaki ............... H01L 31/103
257/414
2008/0237763 A1 10/2008 Miura et al.
2012/0199826 A1 8/2012 Nakahara et al.

FOREIGN PATENT DOCUMENTS

JP 2004-087979 3/2004
JP 2008-251709 10/2008
(Continued)

OTHER PUBLICATIONS

Kuroda, et al., "A FSI CMOS Image Sensor with 200-1000 nm Spectral Response and High Robustness to Ultraviolet Light Exposure", ITE Technical Report, vol. 37, No. 40 (2013) 21-4.

Primary Examiner — Selim U Ahmed
(74) Attorney, Agent, or Firm — Venable LLP

(57) ABSTRACT

To provide a solid-state light-receiving device for ultraviolet light which can measure the amount of irradiation with ultraviolet light harmful to the human body using a simplified structure and properly and accurately, which can be readily integrated with a sensor of a peripheral circuit, which is small, light-weight, and low-cost, and which is suitable for mobile or wearable purposes. One solution is a solid-state light-receiving device for ultraviolet light which is provided with a first photodiode (1), a second photodiode (2), and a differential circuit which receives respective signals based on outputs from these photodiodes, wherein a position of the maximum concentration of a semiconductor impurity is provided in each of the photodiodes (1,2) and in a semiconductor layer region formed on each photodiode, and an optically transparent layer having a different wavelength
(Continued)

selectivity is provided on a light-receiving surface of each photodiode.

20 Claims, 18 Drawing Sheets

(51) Int. Cl.
*G01J 1/42* (2006.01)
*G01J 1/44* (2006.01)
*H01L 31/0352* (2006.01)

(58) Field of Classification Search
CPC .......... G01J 1/0233; G01J 1/0271; G01J 1/44; G01J 1/429; G01J 2001/446; G01J 2001/4266; G01J 2001/0276; H02S 40/44
See application file for complete search history.

(56) References Cited

FOREIGN PATENT DOCUMENTS

| | | |
|---|---|---|
| JP | 2011-238757 | 11/2011 |
| JP | 2012-216756 | 11/2012 |

* cited by examiner

[Fig. 1A]
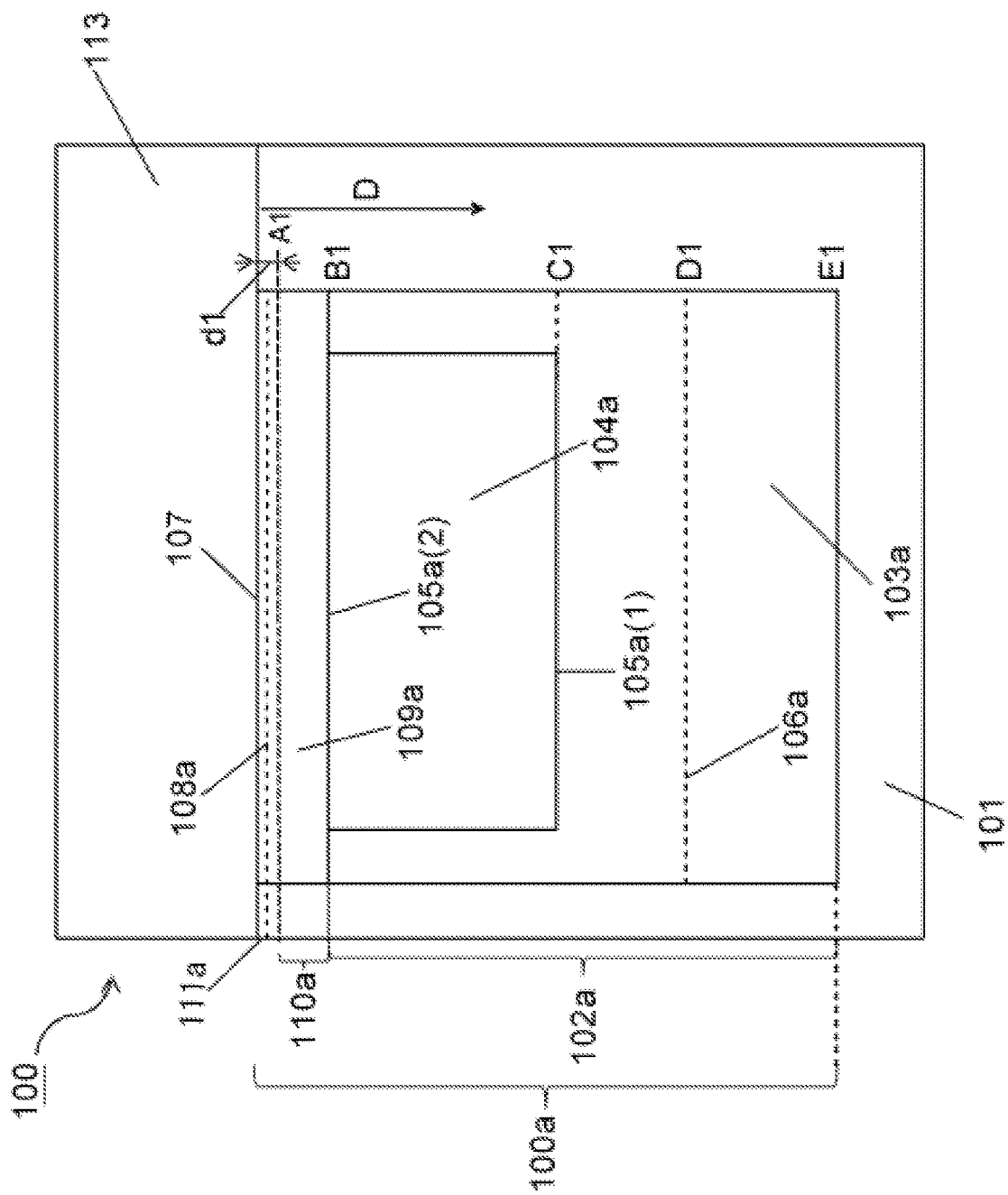

[Fig. 1B]
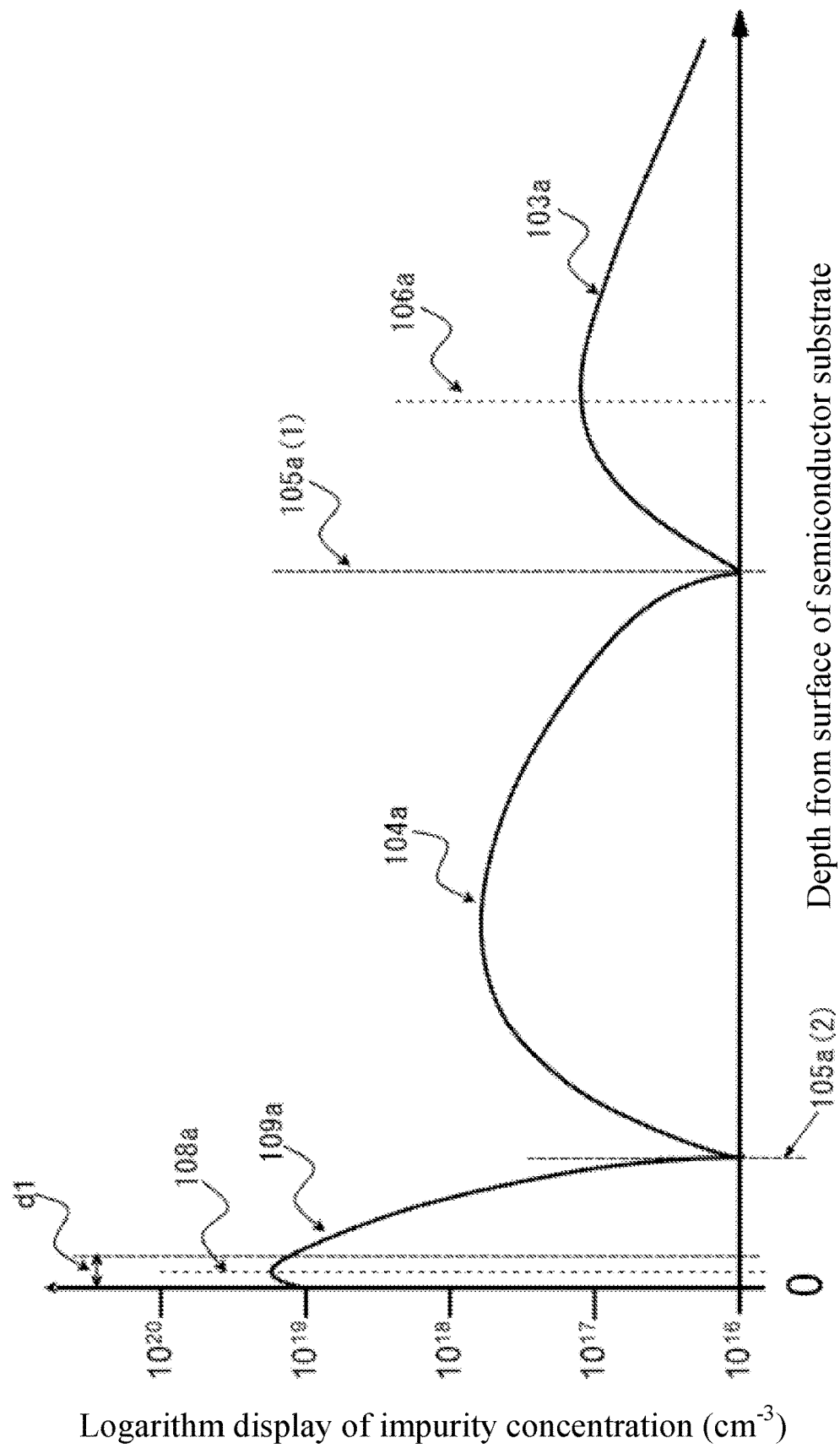

[Fig. 2A]
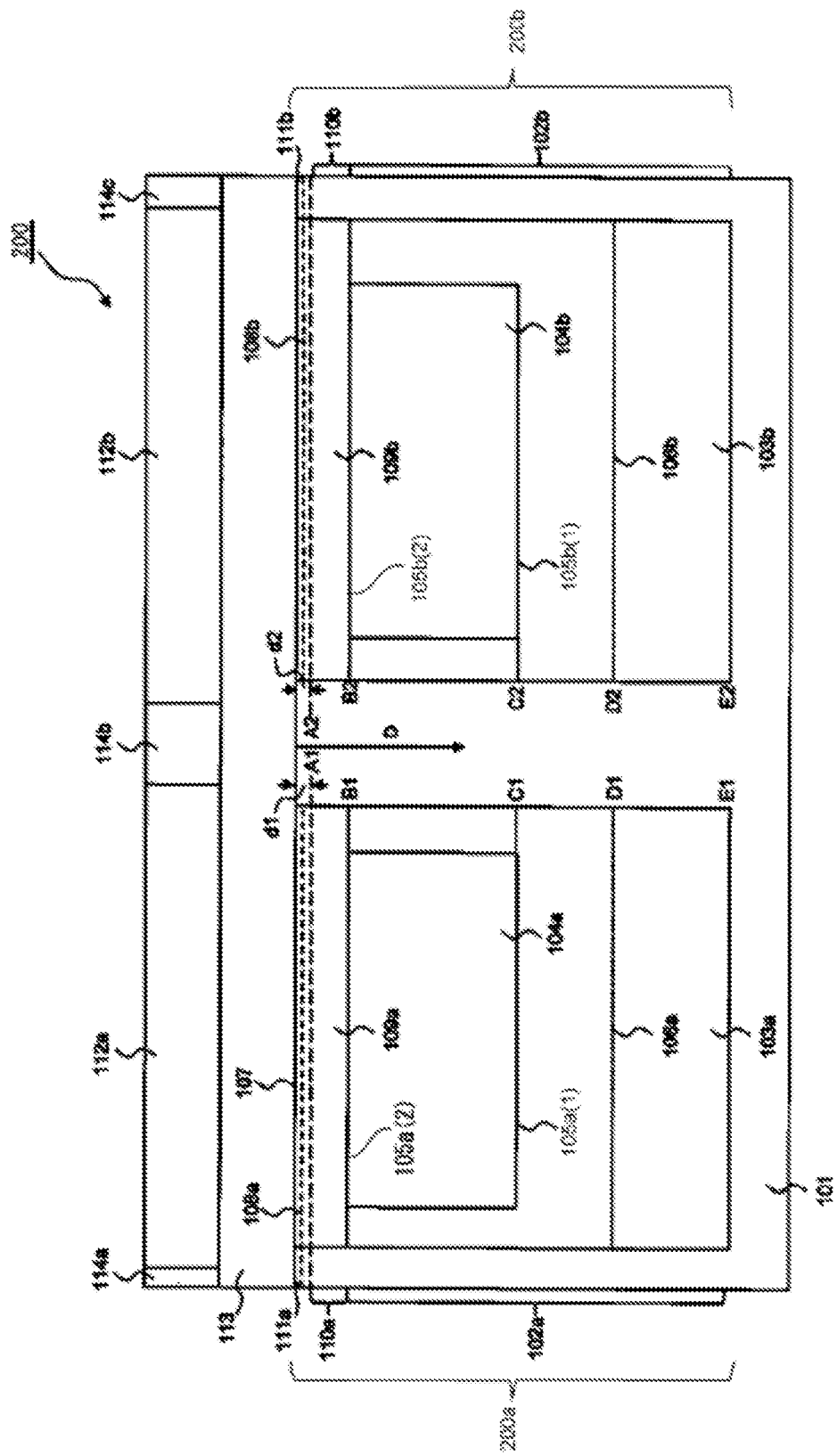

[Fig. 2B]
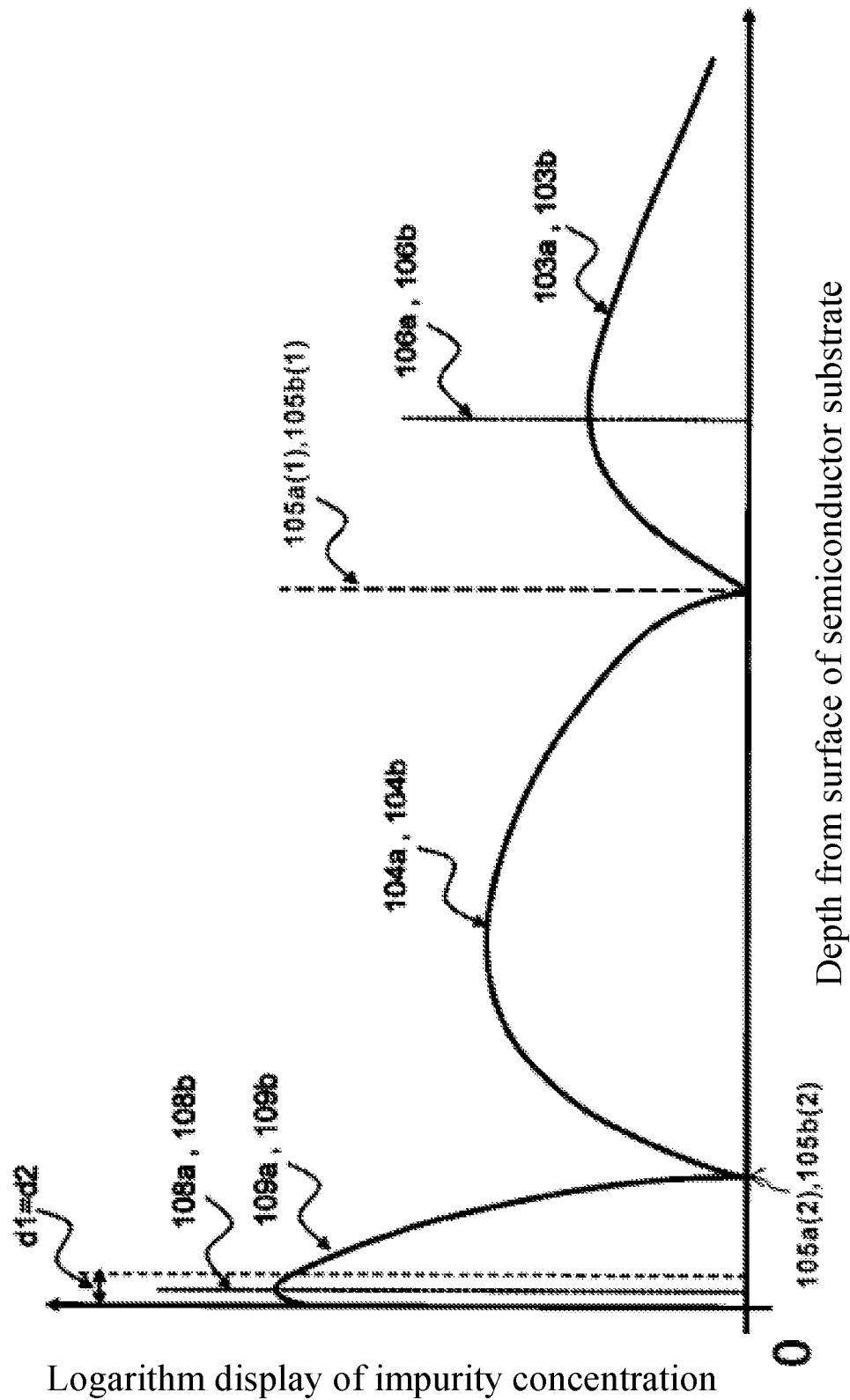

[Fig. 3]
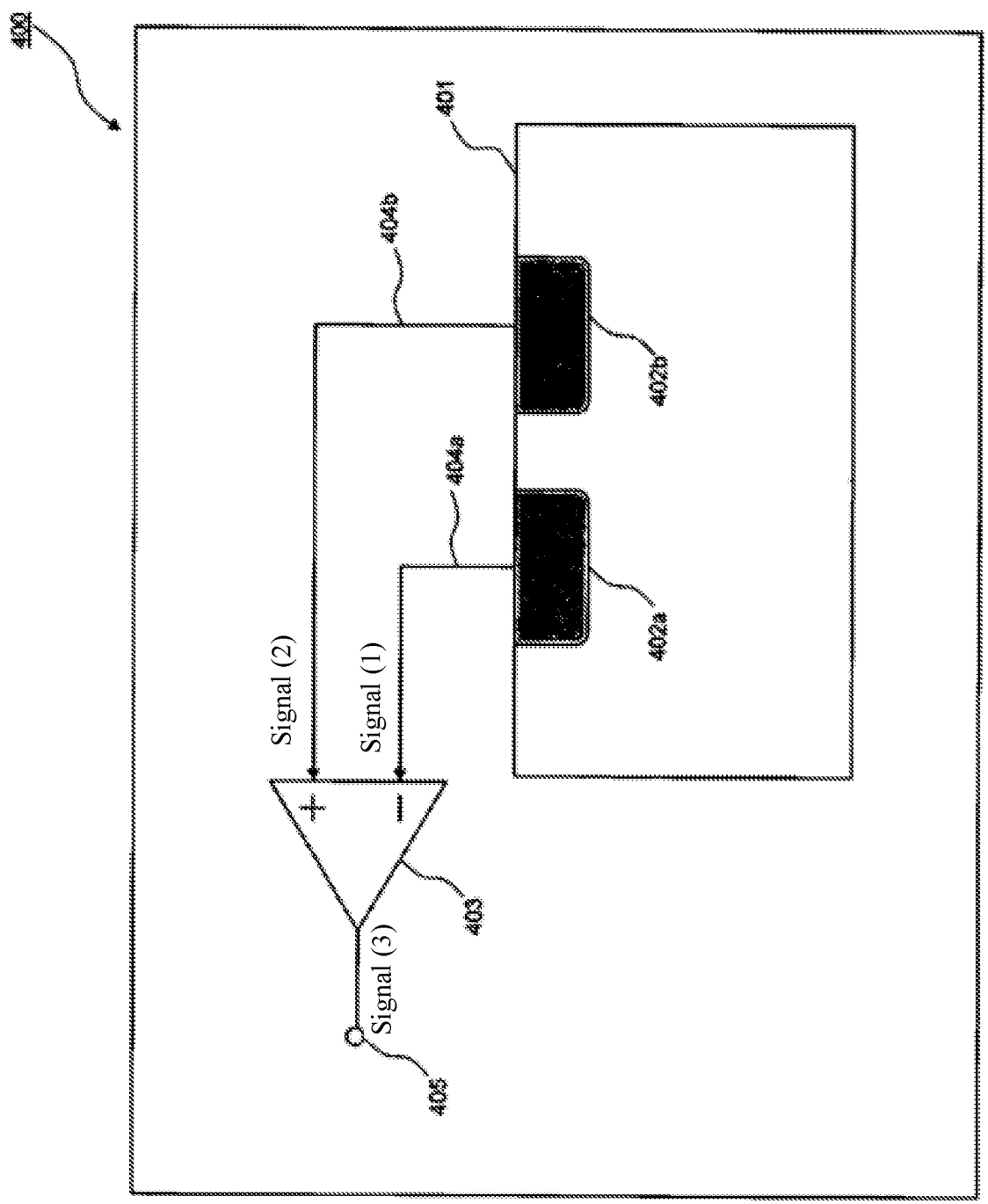

[Fig. 4]
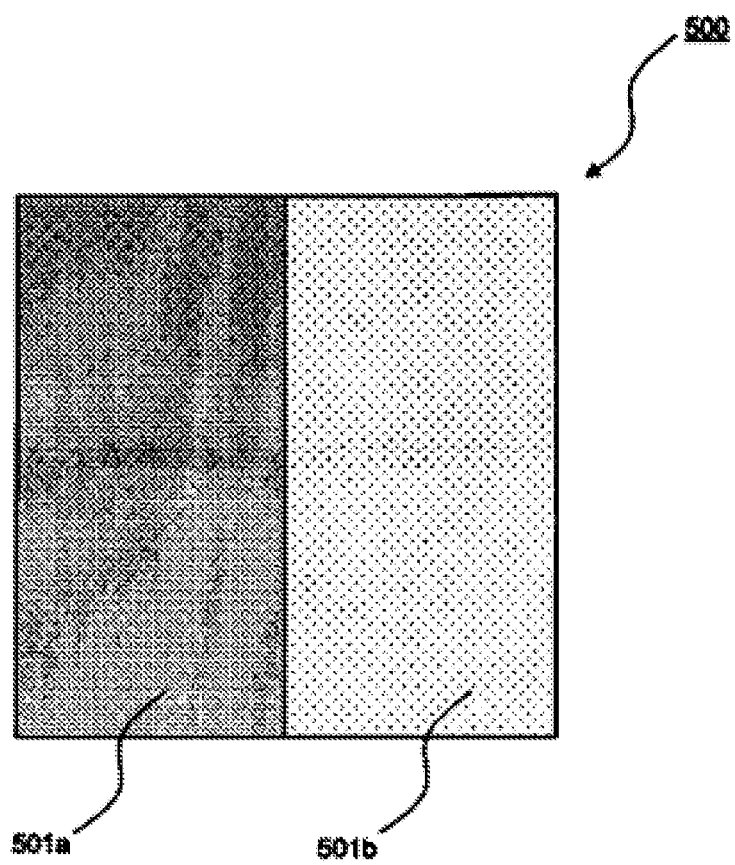

[Fig. 5]
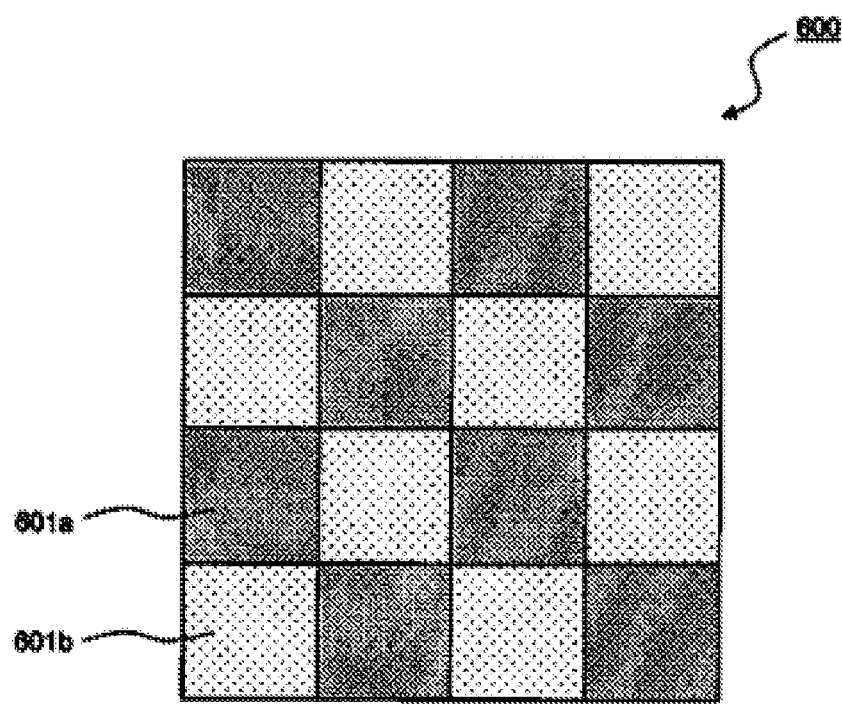

[Fig. 6]
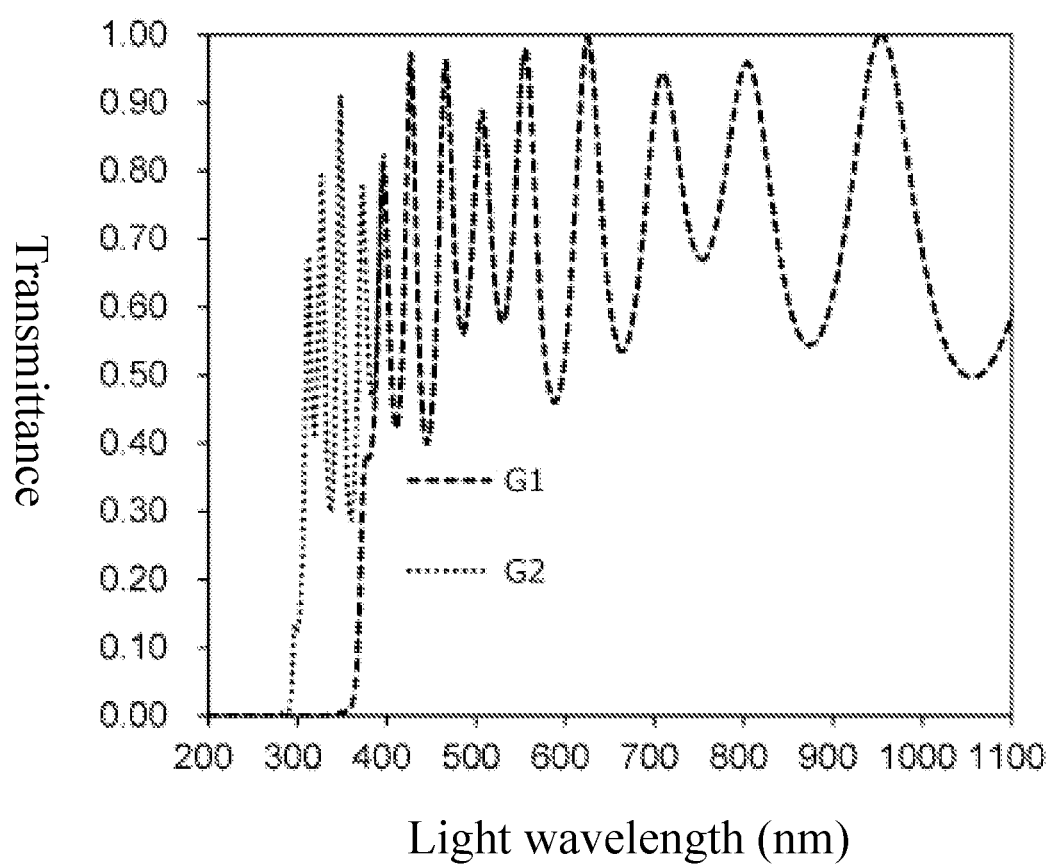

[Fig. 7]
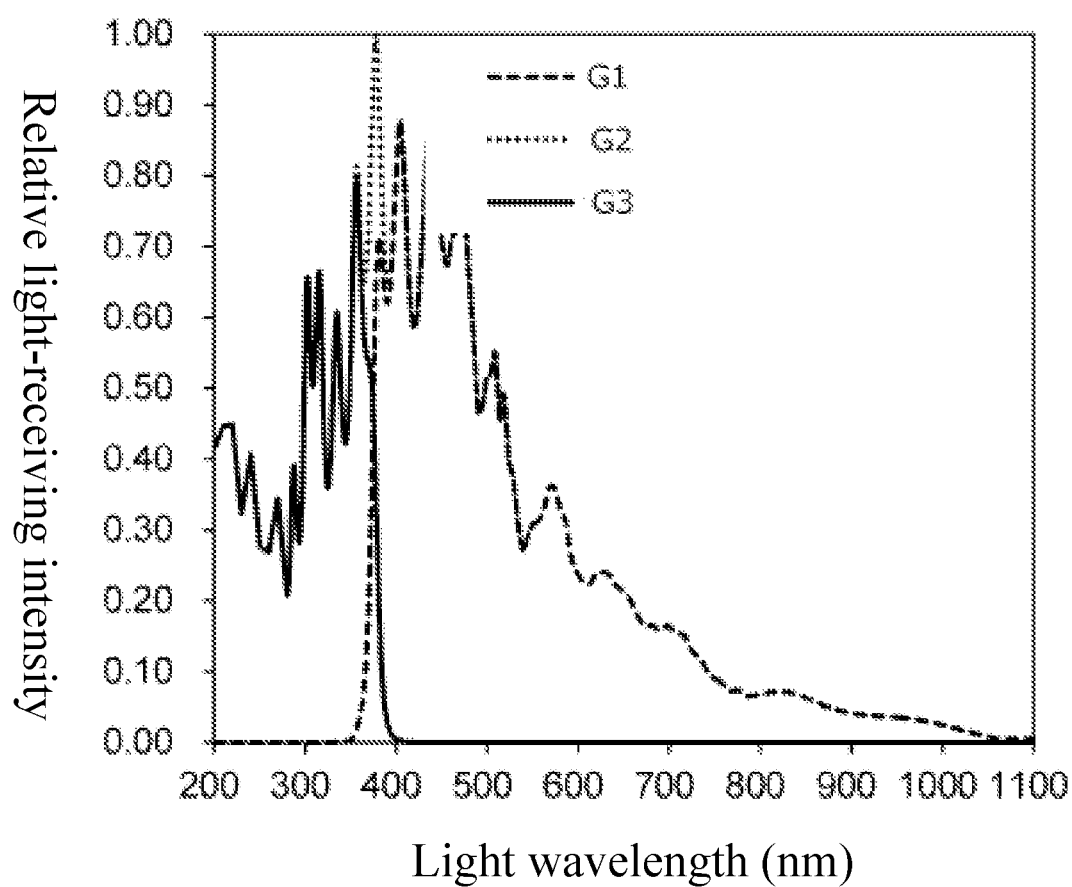

[Fig. 8]
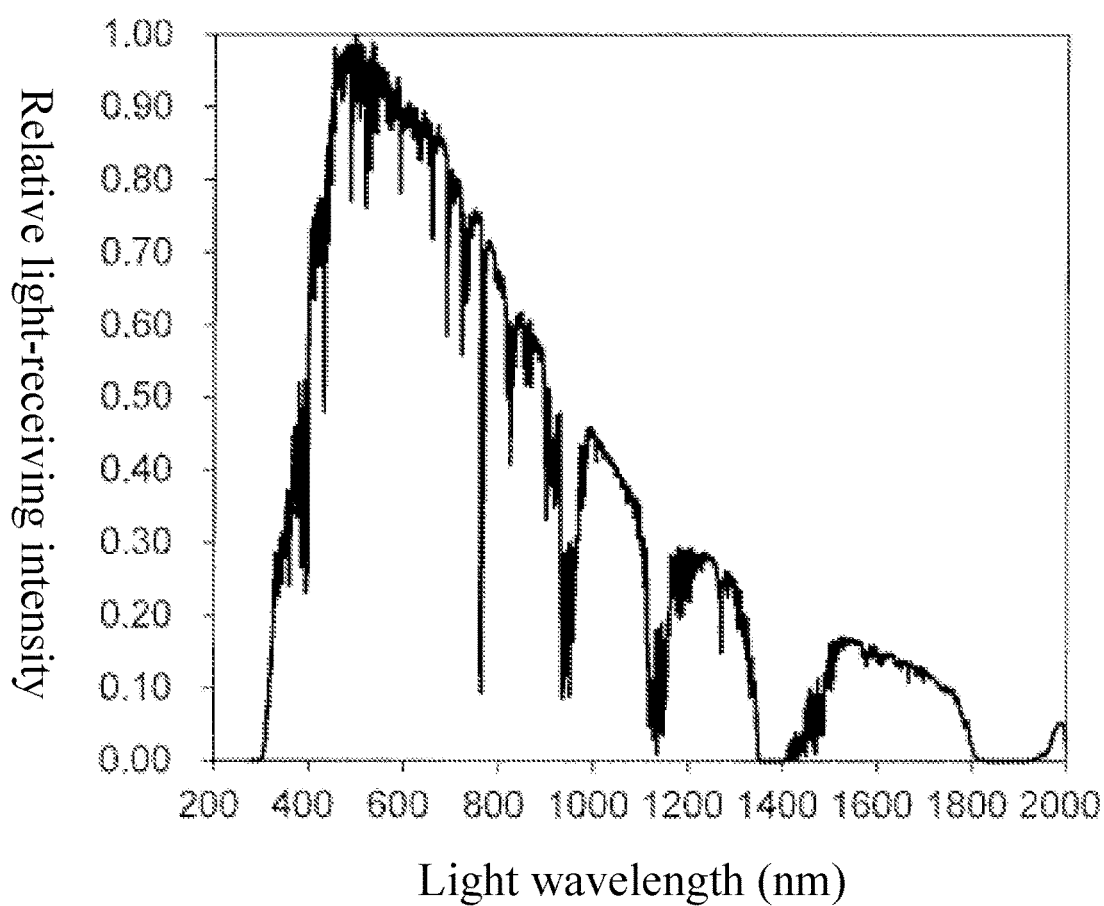

[Fig. 9]
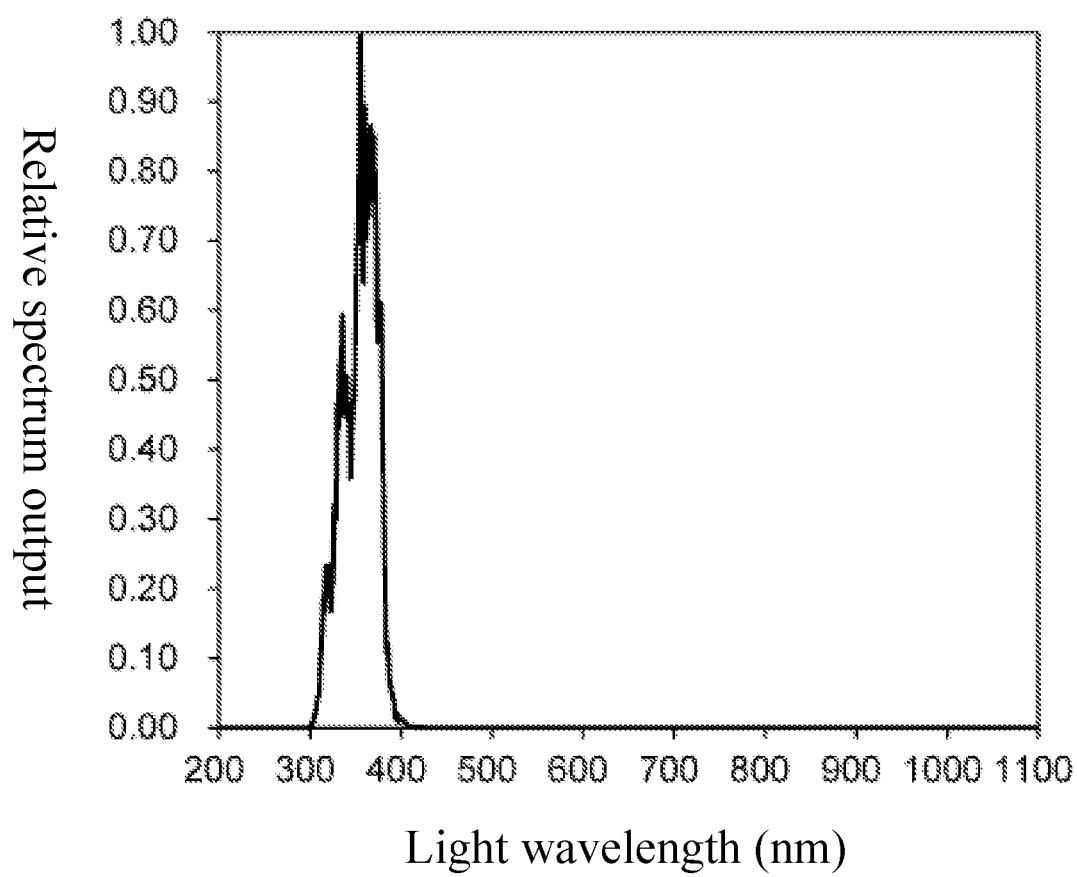

[Fig. 10]
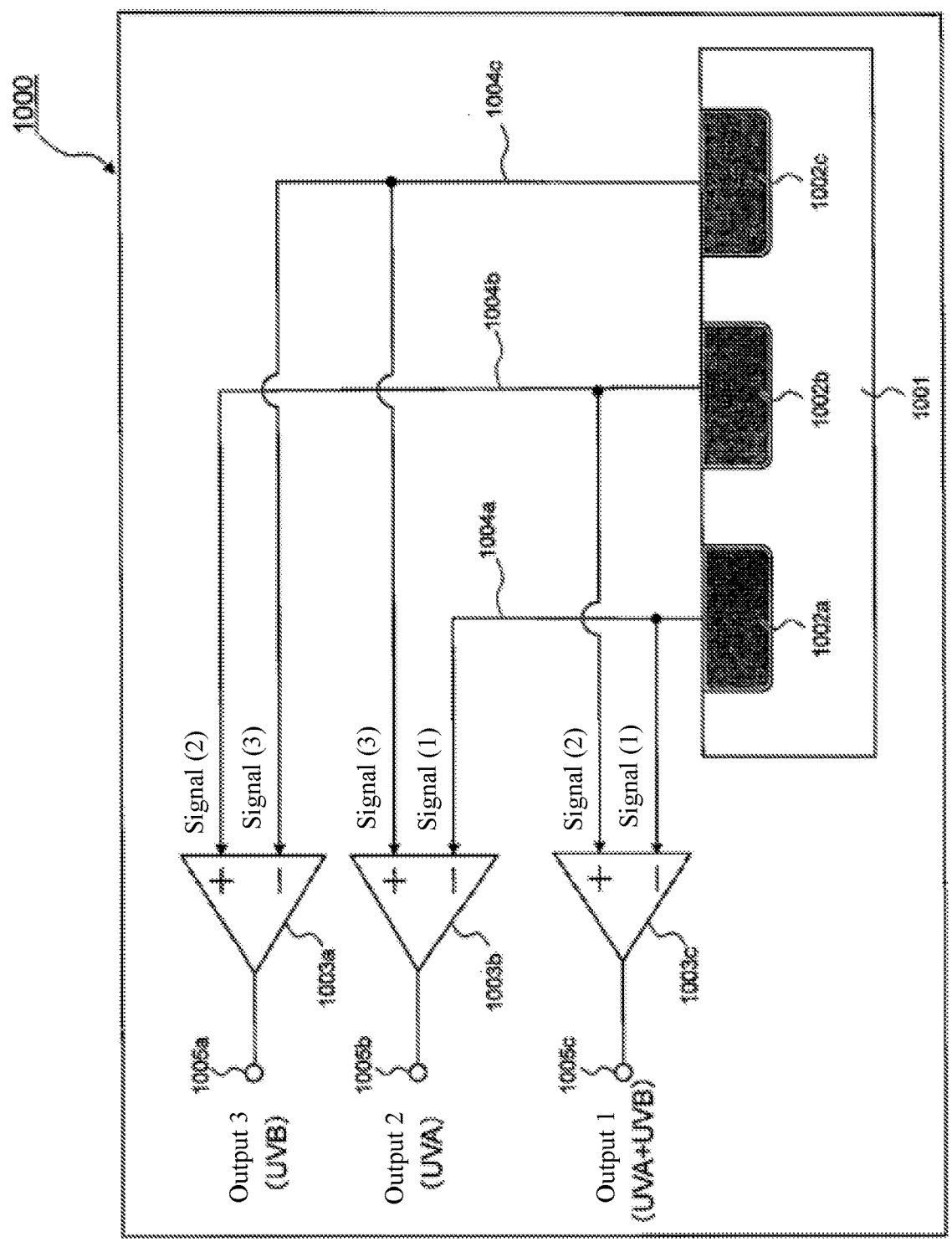

[Fig. 11]
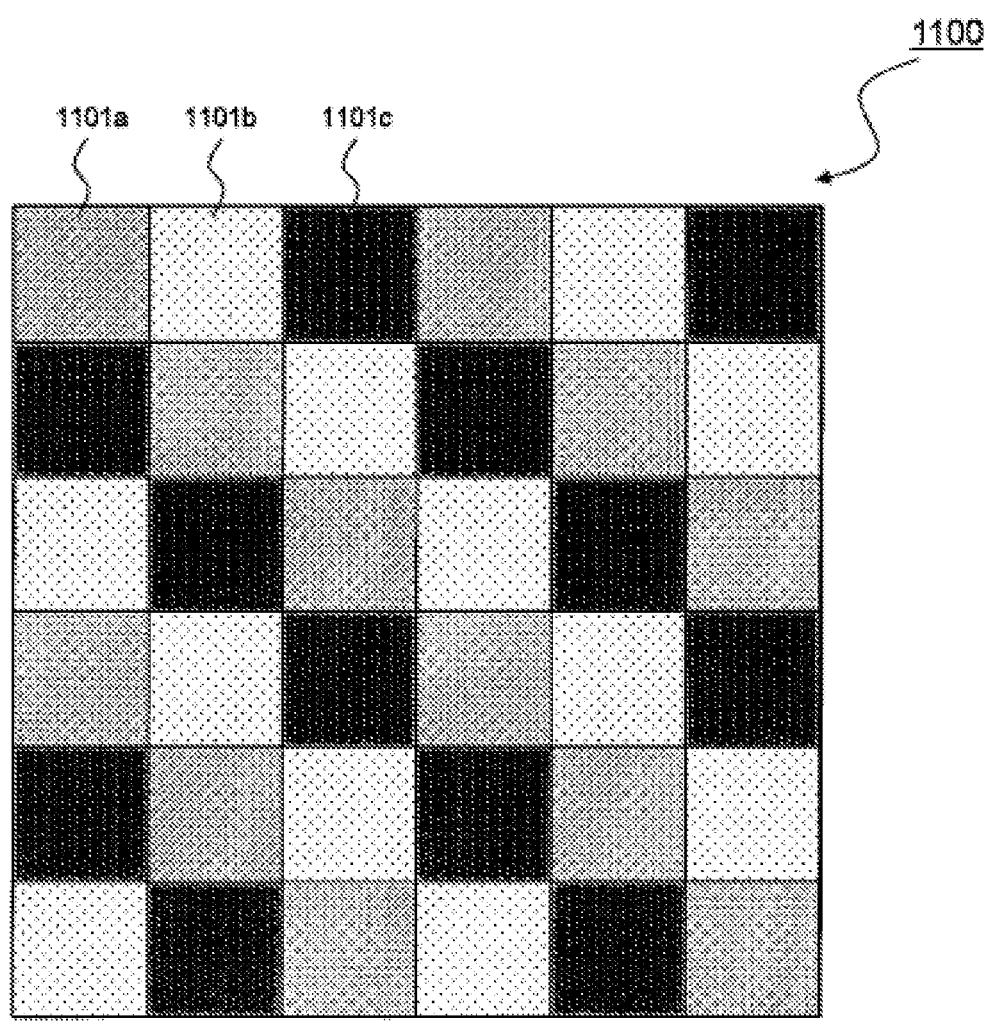

[Fig. 12]
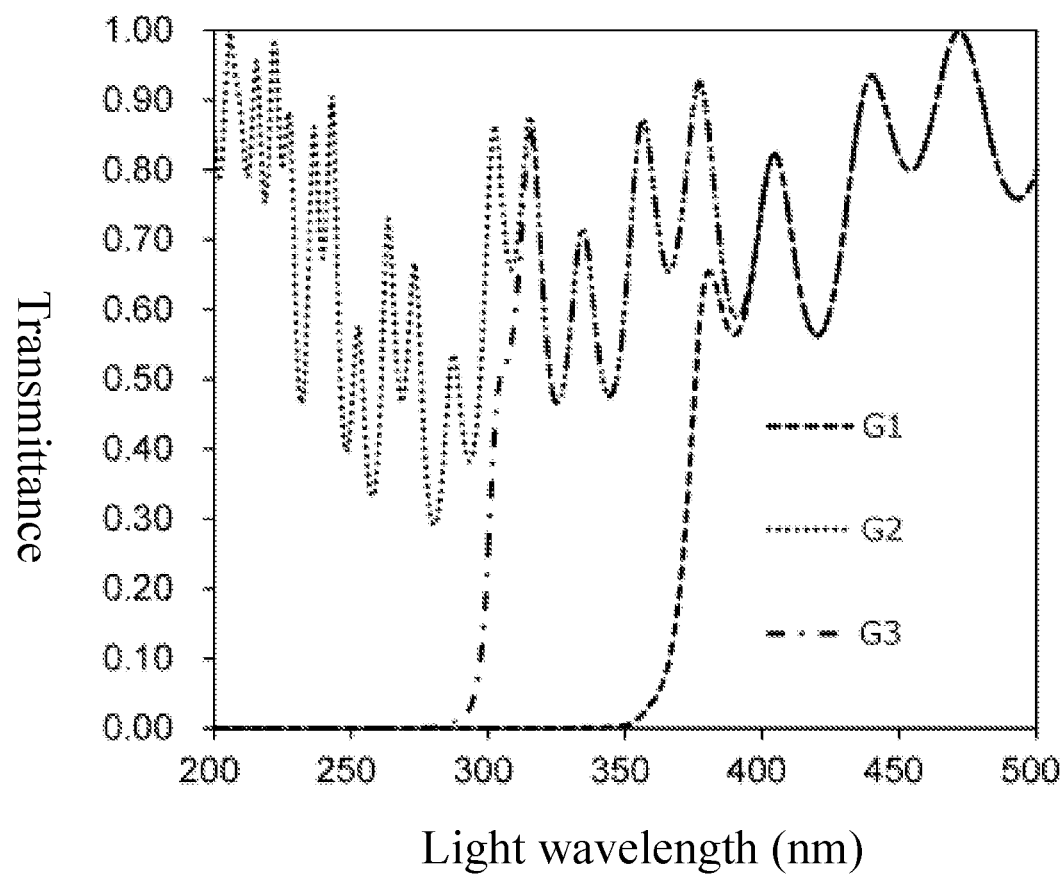

[Fig. 13]
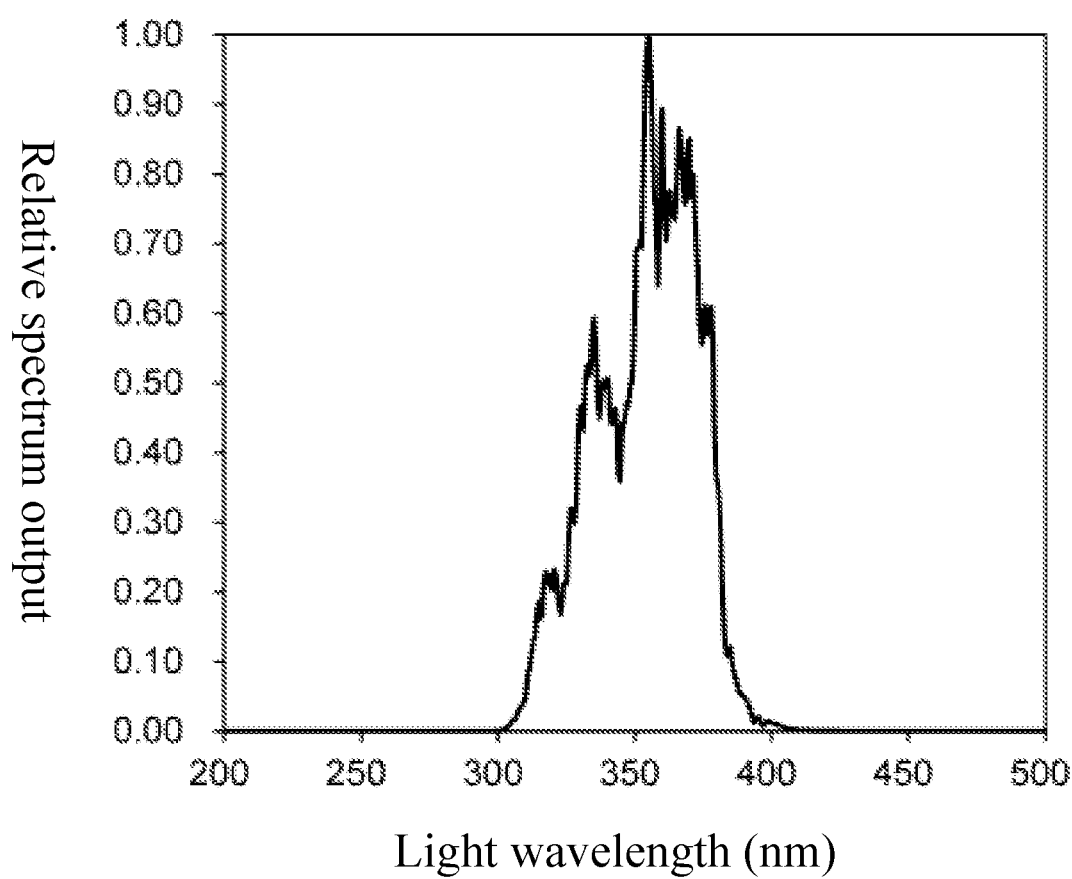

[Fig. 14]
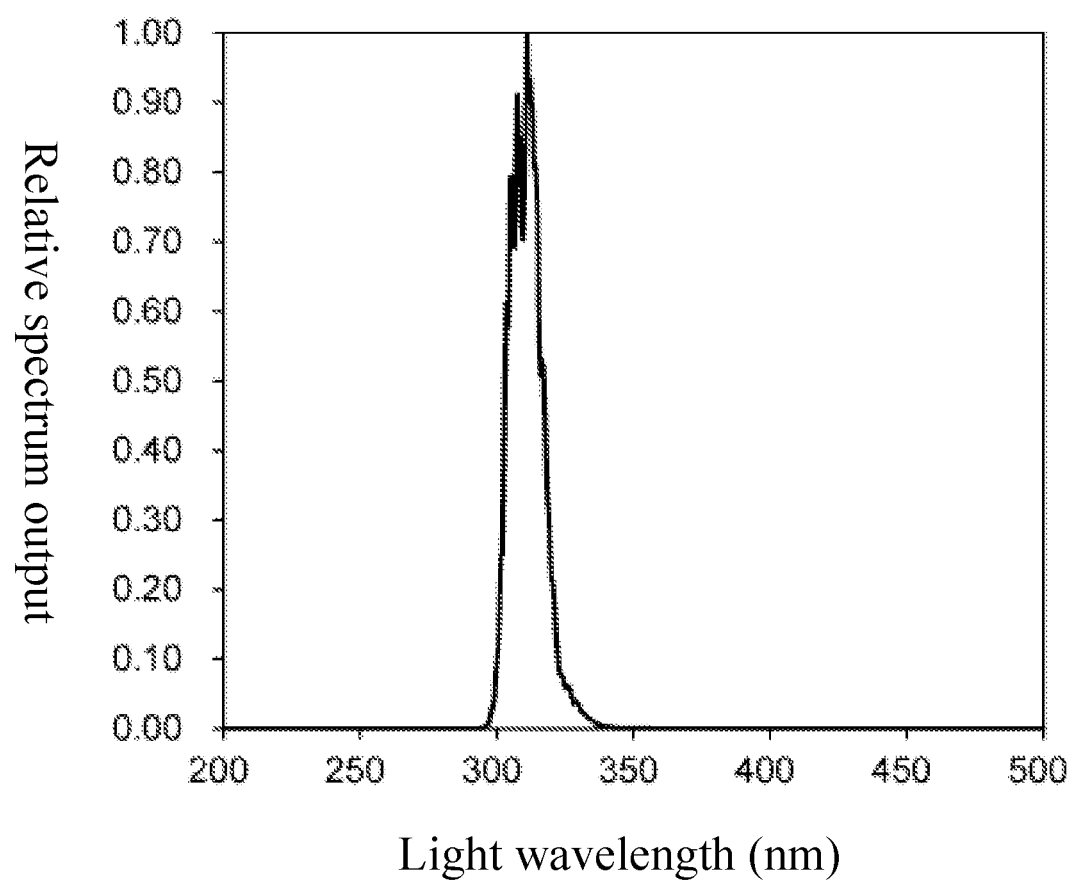

[Fig. 15A]
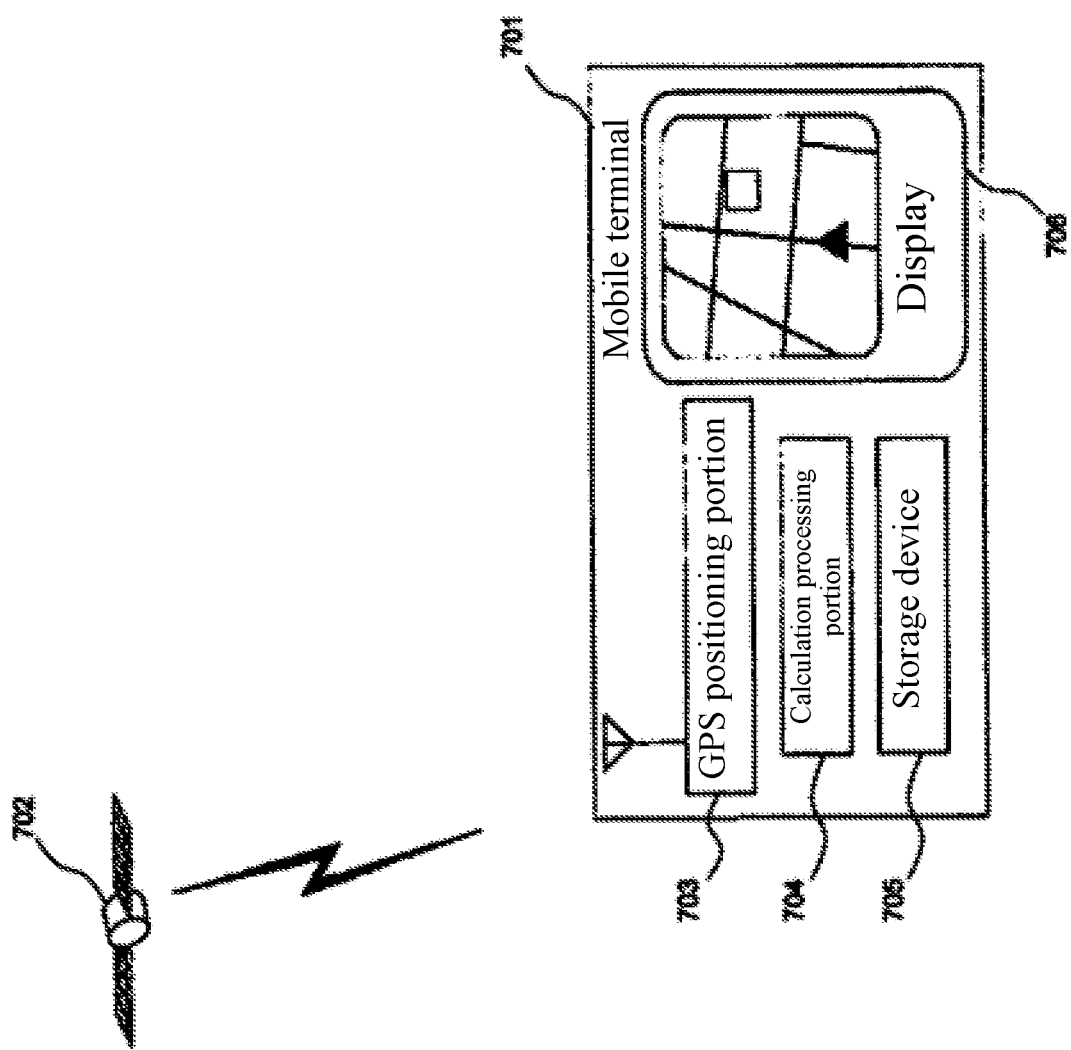

[Fig. 15B]
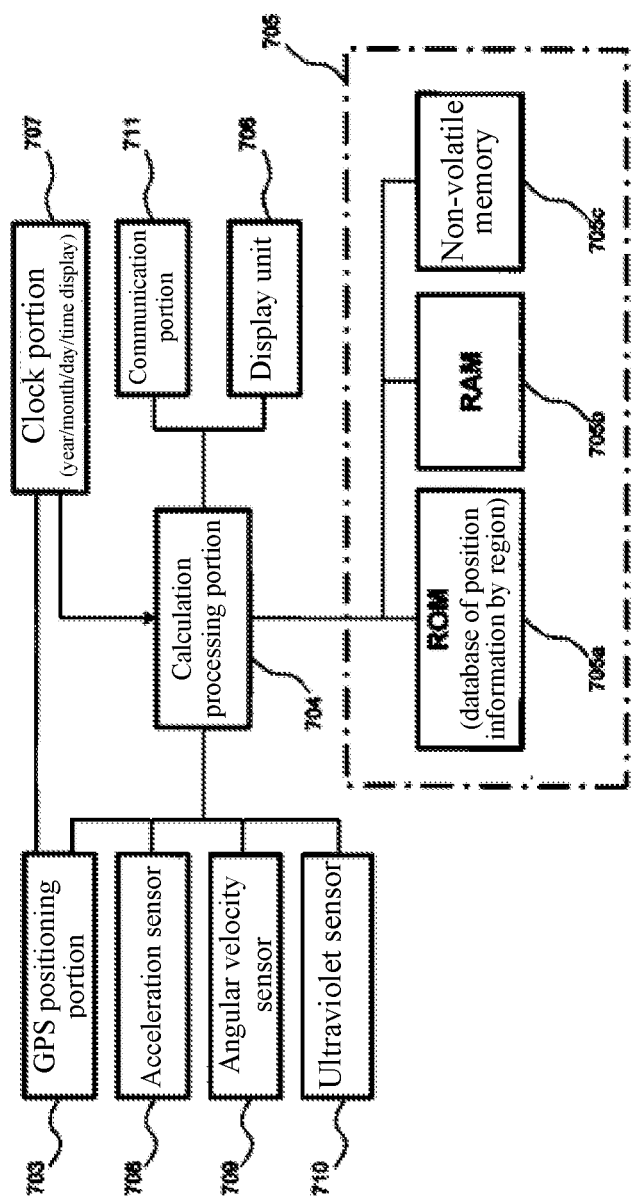

SOLID-STATE LIGHT-RECEIVING DEVICE FOR ULTRAVIOLET LIGHT

This application is a national phase of PCT Application No. PCT/JP2015/063180 filed May 7, 2015, which in turn claims benefit of Japanese Patent Application No. 2014-097547 filed May 9, 2014.

BACKGROUND OF THE INVENTION

Field of the Invention

The present invention relates to a solid-state light-receiving device for ultraviolet light.

Description of the Background Art

Recently, fields that use a solid-state light-receiving device for ultraviolet light have increased in variety and are showing a trend toward further increase in the future.

Within these fields, ultraviolet (UV) protection for protecting the skin against the ultraviolet rays of sunlight has been a significant issue for humankind from the viewpoint of not only beauty, but also the prevention of skin cancer. As a result, the market for a solid-state light-receiving device for ultraviolet light for UV protection is trending toward further increase in the future.

Furthermore, the threat of ultraviolet light (UV rays; ultraviolet rays) in association with the formation and expansion of ozone holes as well as the fear of skin cancer caused by UV ray irradiation, in particular, pertain to all humans, not just those in the southern hemisphere where there is significant ozone hole expansion, making countermeasures therefor a great concern.

On the other hand, a light suntan still serves as a foundation for health and attractiveness, and often the young actively bathe in the sun. Furthermore, from the viewpoint of health maintenance, sun exposure is required to obtain vitamin D. From these viewpoints, bathing in the sun while avoiding ultraviolet light harmful to the human body (UV-A: 315 to 380 nm wavelength, UV-B: 280 to 315 nm wavelength, UV-C: 280 to 200 nm or less wavelength) is strongly encouraged.

Such UV protection for protecting the skin and the like from harmful ultraviolet rays include the promotion of sunburn protection (UV protection) by using goods such as hats, elbow-length gloves, and umbrellas, wearing long-sleeve shirts, and applying sunburn prevention cosmetics as well as pharmaceuticals to exposed skin, on a daily basis. However, the amount of ultraviolet rays in sunlight is significant not only under a blazing sun in midsummer, but also under cloudy conditions, and UV protection tends to be neglected now and then on cloudy days. Furthermore, when a person is out and the weather suddenly changes to that having a significant amount of ultraviolet rays, more often than not UV protection is not adequately applied. Hence, recently, to measure ultraviolet rays and ensure the establishment of appropriate UV protection, mobile ultraviolet light sensors (solid-state light-receiving devices for ultraviolet light) have started to be proposed and commercialized.

In addition of the fields of sunlight UV protection described above, the large market of solid-state light-receiving devices for ultraviolet light includes the following fields.

That is, the large market includes analytical device fields such as measuring devices, atomic absorption analysis, high-performance liquid chromatography (HPLC), and exhaust gas analysis; chemical analysis fields and industrial application fields such as sterilization, food processing, solvent-free organic and inorganic material surface cleaning and treatment, glass and plastic substrate material bonding, and static electricity removal; medical application fields such as DNA cleavage and eye care; and semiconductor lithography equipment fields. These fields are expected to grow in importance and expand in market size, and international competition among countries is expected to intensify in the future.

In these fields, ultraviolet rays of a wavelength region of 400 nm or less are used. While the wavelength region differs somewhat according to the method of classification, the ultraviolet rays of each classified wavelength region are given the names below.

Near ultraviolet rays (wavelength: 380 to 200 nm)
   UV-A (wavelength: 380 to 315 nm)
   UV-B (wavelength: 315 to 280 nm)
   UV-C (wavelength: 280 to 200 nm)
Far ultraviolet rays (far UV, FUV) or vacuum ultraviolet rays (vacuum UV, VUV) (hereinafter together referred to as far ultraviolet rays) (wavelength: 200 to 10 nm)
Extreme ultraviolet rays (extreme UV, EUV, or XUV) (wavelength: 10 to 1 nm)

However, in photolithography and laser technology, deep ultraviolet rays (deep UV, DUV) differs from FUV described above, and refers to ultraviolet rays having a wavelength of 300 nm or less.

Examples of representative fields of ultraviolet application by wavelength region, or fields in which market expansion is expected in the future, include the following:

(1) Extreme ultraviolet rays (EUV) having a wavelength of 13.5 nm
   Semiconductor lithography, liquid immersion lithography
   Beam line: Resist and mask evaluation
   Extreme-ultraviolet imaging spectrometers (EIS) that carry out spectroscopic observations and solar atmospheric diagnoses in the extreme ultraviolet region
   Microelectronics, nanoscale processing
   Living cell holography
   High-temperature, high-density plasma diagnostics
   X-ray microscopes (2) Deep ultraviolet light-emitting diodes (LEDs) (wavelength: 200 to 350 nm)

This range is increasing in importance across a wide variety of fields, from information and electronic devices to safety & health, environmental, and medical applications.
   High-density optical information recording
   Bacteria and virus sterilization, drinking water and air purification
   Biosensing
   Biomaterial analysis
   Optical lithography
   In-hospital infection prevention, photo-surgery treatment
   Ultraviolet irradiation devices (excimer irradiation devices, LED irradiation devices)
   Oxide film removal, surface modification, dry cleaning, UV curing, adhesion, drying In these fields, use of vacuum ultraviolet light sources, Xe excimer light sources, and deuterium lamps (D2Ls) having a light emission intensity in a far ultraviolet bandwidth of about a 200-nm light wavelength and a vacuum ultraviolet bandwidth of about a 200-nm or less wavelength has increased, and this trend is expected to continue in the future.

As light level monitor means for a light source used in these applications, a solid-state light-receiving device for ultraviolet light is required.

However, in a solid-state light-receiving device for ultraviolet light for a light level monitor or a mobile ultraviolet light sensor used for UV protection, an amount of light in the ultraviolet bandwidth often needs to be accurately measured with ambient light existing in the background.

For example, sunlight includes ultraviolet light as well as visible light and infrared light. Thus, when an amount of irradiation of ultraviolet light is measured, the amount of irradiation of ultraviolet light cannot be accurately measured unless the effects of light rays other than ultraviolet light on measured values are avoided.

A solid-state light-receiving device for ultraviolet light for a light level monitor or a mobile ultraviolet light sensor used for UV protection has spectral response characteristics of that wide range, and a solid-state light-receiving device for ultraviolet light that uses bulk silicon (Si) as a semiconductor substrate (hereinafter also expressed as "bulk Si-type solid-state light-receiving device for ultraviolet light") is representative of such a device.

In the case of the bulk Si-type solid-state light-receiving device for ultraviolet light, the silicon (Si) layer is sensitive to ultraviolet light as well as visible light and infrared light, and therefore requires, for example, a visible light and infrared light cut optical filter, which increases costs.

One example of a solution to this problem is the use of a thin film silicon on insulator (SOI) substrate (Non-Patent Documents 1 and 2).

The UV sensors set forth in Non-Patent Documents 1 and 2 utilize the relative ease of the transmission of visible and infrared light with a thin SOI layer, making the UV sensors have selectively high sensitivity to light mainly having a wavelength of 400 nm or less.

In addition, for example, there is a light-detecting device for ultraviolet light detection (solid-state light-receiving device for ultraviolet light) set forth in Patent Document 1.

The light-detecting device set forth in Patent Document 1 is made of MgXZn1-XO (0≤X<1), comprises a first light-detecting portion that includes a light-absorbing semiconductor layer that absorbs light of a wavelength range $\lambda$ further on a light-receiving surface side than a photoelectric conversion region, and a second light-detecting portion that includes a transmitting film without a light absorption region further on the light-receiving surface side than the photoelectric conversion region. This light-detecting device measures the amount of light in the wavelength range $\lambda$ by calculating signals of the first light-detecting portion and signals of the second light-detecting portion.

NON-PATENT DOCUMENTS

Non-Patent Document 1: "Developing the SOI UV Sensor IC," Miura et. al., OKI Technical Review, October 2007/ No. 211, Vol. 74, No. 3, pp. 38-39
Non-Patent Document 2: "A UV sensor IC based on SOI technology for UV care application," SICE Annual Conference 2008, Aug. 20-22, 2008, The University of Electro-Communications, Japan, pp. 317-320

PATENT DOCUMENTS

Japanese Laid-Open Patent Application No. 2012-216756

SUMMARY OF THE INVENTION

Problems to be Solved by the Invention

Nevertheless, while the bulk Si-type solid-state light-receiving device for ultraviolet light has spectral response characteristics of a wide range and is thus superior, the inventors of the present application earnestly researched and investigated general-purpose solid-state light-receiving devices for ultraviolet light suited for the various applications described above and found that the solid-state light-receiving devices for ultraviolet light of the preceding examples described above are not necessarily satisfactory.

In particular, while the preceding examples were suitable for ultraviolet rays in the near ultraviolet region, the examples were not suitable as solid-state light-receiving devices for ultraviolet rays having a short wavelength of the far ultraviolet region or less.

This is presumably because a photon energy of the ultraviolet rays in the far ultraviolet region is a large 6 eV or greater, and greatly affects deterioration of key characteristics, namely sensitivity and dark current characteristics, of the solid-state light-receiving device. This deterioration increases to an extreme particularly when exposure to ultraviolet rays having high light energy continues for a long period of time.

Thus, it is desirable to provide a solid-state light-receiving device for ultraviolet rays that is practically and substantially unproblematic even if exposure to ultraviolet rays of any wavelength in the wide ultraviolet region of 10 to 400 nm continues for a long period time, and regardless of whether or not deterioration occurs in the key characteristics.

Moreover, the UV sensors set forth in Non-Patent Documents 1 and 2 are still sensitive to light having a wavelength of 380 nm or greater (refer to FIG. 1 in Non-Patent Document 1, and FIG. 5 in Non-Patent Document 2), and do not sufficiently resolve the problems.

As yet another solution, the SOI layer may be further thinned. However, if so, difficulties arise in integration with peripheral circuits, a special feature of such a device, and therefore decreasing the thickness of the SOI layer is not preferred.

Further, the UV sensors set forth in Non-Patent Documents 1 and 2 have a thin SOI layer, resulting in a horizontal p-n junction since incorporation of a vertical p-n junction is not possible. As a result, a depletion layer of the p-n junction comes into contact with an interface between the SOI layer and an insulator layer in contact with a top and a bottom of the SOI layer, thereby affecting the interface state and thus causing the problems that should be solved, i.e., low sensitivity and high dark current density, to remain. Furthermore, there is also the problem that the number of cases in which sensitivity and dark current characteristics deteriorate due to ultraviolet light irradiation for a long period of time is not few.

The present invention is the result of close investigation and research into such points, and it is therefore a main object of the present invention to provide a solid-state light-receiving device for ultraviolet light that is simple in structure and at least substantially free of sensitivity deterioration and decreases in dark current characteristics, even if continually irradiated by ultraviolet rays of a wide ultraviolet region of 10 to 400 nm for a long period of time.

It is also another object of the present invention to provide a solid-state light-receiving device for ultraviolet light that is simple in structure, capable of accurately and appropriately measuring an amount of irradiation of ultraviolet light harmful to the human body, capable of easy integration with a sensor of a peripheral circuit, and stable in terms of initial characteristics, even in response to long-term irradiation of ultraviolet rays in a wide ultraviolet wavelength region.

It is also yet another object of the present invention to provide a solid-state light-receiving device for ultraviolet light that is small, light-weight, and low-cost, suitable for mobile or wearable purposes, and stable in terms of key characteristics, even in response to long-term irradiation of ultraviolet rays in a width wavelength region.

Means for Solving the Problems

According to a first aspect of the present invention, a solid-state light-receiving device (D1) for ultraviolet light comprises:

a semiconductor substrate containing silicon (Si) as a main component, and a photodiode (1) formed inside the semiconductor substrate;

the photodiode (1) having, from a rear surface side of the substrate, a layered configuration comprising a semiconductor region (1) of a first conductive type and a semiconductor region (2) of a second conductive type different from the first conductive type and forming a semiconductor coupling with the semiconductor region (1);

the semiconductor region (2) containing semiconductor impurities (2) of the second conductive type; and a content concentration distribution of the impurities (2) in a depth direction from a light-incident side surface of the semiconductor region (2) having a maximum concentration position (2) of at least $1\times1,019/cm^3$ in a layer region (2) within at least 1 nm.

According to a second aspect of the present invention, a solid-state light-receiving device (D2) for ultraviolet light comprises:

a semiconductor substrate containing silicon (Si) as a main component, and a photodiode (1) formed inside the semiconductor substrate;

the photodiode (1) having, from a rear surface side of the substrate, a layered configuration comprising a semiconductor region (1) of a first conductive type and a semiconductor region (2) of a second conductive type different from the first conductive type and forming a semiconductor coupling with the semiconductor region (1);

the semiconductor region (2) containing semiconductor impurities (2) of the second conductive type; and a content concentration distribution of the impurities (2) in a depth direction from a light-incident side surface of the semiconductor region (2) having a maximum concentration position (2) in a layer region (2) within at least 1 nm, and a concentration of the impurities (2) at the maximum concentration position (2) being no less than a concentration where all or substantially all lines of electric force that occur by a fixed charge produced by irradiation of far ultraviolet light terminate.

According to a third aspect of the present invention, a solid-state light-receiving device (D3) for ultraviolet light comprises:

a semiconductor substrate containing silicon (Si) as a main component, a first photodiode (PD1) and a second photodiode (PD2) disposed inside the semiconductor substrate so as to not effectively overlap three-dimensionally, and differential signal processing means for receiving a signal (1) on the basis of an output (1) of the photodiode (PD1) and a signal (2) on the basis of an output (2) of the photodiode (PD2);

(A) the photodiode (PD1) and the photodiode (PD2) having been formed under identical semiconductor manufacturing process conditions inside the semiconductor substrate;

(B) the photodiodes (PD) each comprising:

(a) a semiconductor layer region (1) of a first conductive type (1), a semiconductor layer region (2) of a second conductive type (2) that differs in polarity from the first conductive type (1) and is provided on the semiconductor layer region (1), and a semiconductor layer region (3) of the first conductive type (1) provided on the semiconductor layer region (2);

(b) the semiconductor layer region (2) and the semiconductor layer region (3) forming a semiconductor junction;

(c) the semiconductor layer region (1) containing semiconductor impurities (1) with a concentration distributed in a layer thickness direction and a position (1) of a maximum concentration (1) provided in the distribution;

(d) the semiconductor layer region (3) containing semiconductor impurities (1) with a concentration distributed in a layer thickness direction and a position (3) of a maximum concentration (3) provided in the distribution;

(e) the position (3) being provided on a layer region (II) within 1 nm in a depth direction from a light-incident side surface of at least the semiconductor region (3); and (f) the maximum concentration (3) being at least $1\times1,019/cm^3$; and (C) the solid-state light-receiving device (D3) for ultraviolet light further comprising a first layer (A1) that selectively transmits light of a first wavelength region and spatially covers a light-receiving surface of the first photodiode (PD1), and a second layer (A2) that transmits light of a second wavelength region that differs from the first wavelength region and spatially covers a light-receiving surface of the second photodiode (PD2) on the light-receiving side.

According to a fourth aspect of the present invention, a solid-state light-receiving device (D4) for ultraviolet light comprises:

a semiconductor substrate containing silicon (Si) as a main component, a first photodiode (PD1) and a second photodiode (PD2) disposed inside the semiconductor substrate so as to not effectively overlap three-dimensionally, and differential signal processing means for receiving a signal (1) on the basis of an output (1) of the photodiode (PD1) and a signal (2) on the basis of an output (2) of the photodiode (PD2);

(A) the photodiode (PD1) and the photodiode (PD2) having been formed under identical semiconductor manufacturing process conditions inside the semiconductor substrate;

(B) the photodiodes (PD) each comprising:

(a) a semiconductor layer region (1) of a first conductive type (1), a semiconductor layer region (2) of a second conductive type (2) that differs in polarity from the first conductive type (1) and is provided on the semiconductor layer region (1), and a semiconductor layer region (3) of the first conductive type (1) provided on the semiconductor layer region (2);

(b) the semiconductor layer region (2) and the semiconductor layer region (3) forming a semiconductor junction;

(c) the semiconductor layer region (1) containing semiconductor impurities (1) with a concentration distributed in a layer thickness direction and a position (1) of a maximum concentration (1) provided in the distribution;

(d) the semiconductor layer region (3) containing semiconductor impurities (1) with a concentration distributed in a layer thickness direction and a position (3) of a maximum concentration (3) provided in the distribution;

(e) the position (3) being provided on a layer region (II) within 1 nm in a depth direction from a light-incident side surface of at least the semiconductor region (3); and (f) the maximum concentration (3) being no less than a concentration where all or substantially all lines of electric force that occur by a fixed charge produced by irradiation of far ultraviolet light terminate; and (C) the solid-state light-receiving device (D4) for ultraviolet light further comprising a first layer (A1) that selectively transmits light of a first wavelength region and spatially covers a light-receiving surface of the first photodiode (PD1), and a second layer (A2) that transmits light of a second wavelength region that differs from the first wavelength region and spatially covers a light-receiving surface of the second photodiode (PD2) on the light-receiving side.

According to a fifth aspect of the present invention, an ultraviolet light measuring method (P1) comprises the steps of:
(1) preparing a solid-state light-receiving device (D3) for ultraviolet light;
(2) irradiating ultraviolet light onto a photodiode (PD1) and a photodiode (PD2) to obtain output from each of the photodiodes (PD);
(3) forming a differential signal (DS) by inputting a signal (1) on the basis of an output (1) of the photodiode (PD1) and a signal (2) on the basis of an output (2) of the photodiode (PD2) to differential signal processing means; and
(4) measuring an amount of irradiation of ultraviolet light on the basis of the differential signal (DS).

According to a sixth aspect of the present invention, an ultraviolet light measuring method (P2) comprises the steps of:
(1) preparing a solid-state light-receiving device (D4) for ultraviolet light;
(2) irradiating ultraviolet light onto a photodiode (PD1) and a photodiode (PD2) to obtain output from each of the photodiodes (PD);
(3) forming a differential signal (DS) by inputting a signal (1) on the basis of an output (1) of the photodiode (PD1) and a signal (2) on the basis of an output (2) of the photodiode (PD2) to differential signal processing means; and
(4) measuring an amount of irradiation of ultraviolet light on the basis of the differential signal (DS).

One viewpoint according to the present invention other than the above is an electronic device comprising any one of the solid-state light-receiving devices D1 to D4 for ultraviolet light described above.

Effect of the Invention

According to the present invention, it is possible to accurately and appropriately measure an amount of irradiation of far ultraviolet light and vacuum ultraviolet light harmful to the human body using a simple structure. Further, according to the present invention, it is possible to provide a solid-state light-receiving device for ultraviolet light that is small, light-weight, and low-cost, mountable to various devices, and suitable for mobile or wearable purposes. Furthermore, it is possible to easily and integrally incorporate a peripheral circuit and a sensor into a semiconductor substrate.

BRIEF DESCRIPTION OF THE DRAWINGS

FIG. 1A is a schematically illustrated explanatory view for explaining a suitable example of a configuration of a main portion of a solid-state light-receiving device for ultraviolet light according to the present invention.

FIG. 1B is a graph showing a profile of a semiconductor impurity concentration of the device in FIG. 1A.

FIG. 2A is a schematic explanatory view for explaining another suitable example of a configuration of the solid-state light-receiving device for ultraviolet light according to the present invention.

FIG. 2B is a graph showing a profile of the semiconductor impurity concentration according to a photodiode (PD1) and a photodiode (PD2).

FIG. 3 is a schematically illustrated explanatory view for explaining a basic structure of the solid-state light-receiving device for ultraviolet light according to the present invention.

FIG. 4 is a top view schematically illustrating an example of a layout of a light-incident surface of the main portion of the solid-state light-receiving device for ultraviolet light.

FIG. 5 is a top view schematically illustrating an example of a layout of the light-incident surface of the main portion of the solid-state light-receiving device for ultraviolet light in which 8 pairs of photodiodes (PD1) and photodiodes (PD2) are disposed in a checkered pattern.

FIG. 6 is a graph showing a transmittance of light that enters the photodiode (PD1) and the photodiode (PD2).

FIG. 7 is a graph showing a relative light-receiving sensitivity of the photodiode (PD1), the photodiode (PD2), and the light-receiving device according to the present invention into which these photodiodes are incorporated.

FIG. 8 is a graph showing a spectrum of sunlight that shines down on the ground.

FIG. 9 is a graph showing a relative spectrum output of the light-receiving device according to the present invention taking into consideration FIG. 8.

FIG. 10 is a schematically illustrated explanatory view for explaining another example of the basic structure of the solid-state light-receiving device for ultraviolet light according to the present invention.

FIG. 11 is a top view schematically illustrating an example of the layout of the light-incident surface of the main portion of the solid-state light-receiving device for ultraviolet light in which the first to third photodiodes (PD) of the main portion of the solid-state light-receiving device for ultraviolet light are disposed in a predetermined pattern.

FIG. 12 is a graph showing transmission characteristics of light that enters the first photodiode (PD1), the second photodiode (PD2), and a third photodiode (PD3).

FIG. 13 is a graph showing a relative light-receiving sensitivity of an output of a difference between a signal (3) based on an output of the third photodiode (PD3), taking into consideration the spectrum of sunlight that shines down on the ground shown in FIG. 8, and a signal (2) based on an output of the second photodiode (PD2).

FIG. 14 is a graph showing a relative light-receiving sensitivity of an output of a difference between the signal (2) based on the output of the second photodiode (PD2), taking into consideration the spectrum of sunlight that shines down on the ground shown in FIG. 8, and the signal (3) based on the output of the third photodiode (PD3).

FIG. 15A is an outline external view illustrating an embodiment of a case in which the present invention is applied to a mobile terminal device FIG. 15B is a block diagram illustrating an internal configuration of the mobile terminal device illustrated in FIG. 15A.

DESCRIPTION OF THE PREFERRED EMBODIMENTS

FIG. 1A is an example of a schematic explanatory view for explaining a suitable example of a configuration of a solid-state light-receiving device for ultraviolet light according to the present invention.

A main portion 100 of the solid-state light-receiving device for ultraviolet light illustrated in FIG. 1A comprises a photodiode (PD) 100a inside a semiconductor substrate 101 containing silicon (Si) as a main component.

The photodiode (PD) 100a comprises layer regions 102a, 110a, 111a.

The layer region 102a comprises a semiconductor layer region 103a of a first conductive type, and a semiconductor layer region 104a embedded in an upper portion of the semiconductor layer region 103a.

Upper portion surfaces of the semiconductor layer region 103a and the semiconductor layer region 104a are aligned as illustrated.

The semiconductor layer region 104a is a second conductive type that differs in polarity from the first conductive type. That is, given that the first conductive type is P, for example, the second conductive type is N.

A semiconductor junction 105a (1) is formed by the semiconductor layer region 103a and the semiconductor layer region 104a.

A semiconductor layer region 109a having the same polarity as the semiconductor layer region 103a is provided on the semiconductor layer region 104a.

A semiconductor junction 105a (2) is formed by the semiconductor layer region 103a and the semiconductor layer region 109a.

The semiconductor layer region 103a and the semiconductor layer region 109a contain first semiconductor impurities (1) and are therefore first conductive types. It should be noted that "semiconductor impurities" is also written as "impurity atoms" hereinafter.

Next, a description will be given with reference to FIG. 1A as well as FIG. 1B.

The semiconductor impurities (1) in the semiconductor layer region 103a are contained in the semiconductor layer region 103a in a state distributed in a layer thickness direction of the semiconductor layer region 103a.

A maximum content concentration position (D1) 106a of the semiconductor impurities (1) is provided in a position downward from the semiconductor junction 105a (1) in the distribution of the semiconductor impurities (1) in the layer thickness direction of the semiconductor layer region 103a. It should be noted that "maximum content concentration position" is also written as "maximum concentration position" hereinafter.

For the semiconductor layer region 109a, similar to the semiconductor layer region 103a, the semiconductor impurities (1) are contained in the semiconductor layer region 109a in a state distributed in the layer thickness direction, and a maximum content concentration position 108a of the semiconductor impurities (1) is provided.

The semiconductor layer region 109a includes the maximum concentration position 108a in an upward portion thereof, and comprises the layer region 111a having a thickness d1 (the thickness from a position of a surface 107 of the semiconductor substrate to a position A1 in a depth direction) regarded as free or effectively free of absorption of UV-A and UV-B light.

In the present invention, the position A1 does not hinder design, even if the same as the position of the maximum concentration position 108a. Nevertheless, if the thickness d1 regarded as free or effectively free of absorption of UV-A and UV-B light is to be maintained, the position A1 is preferably below the maximum concentration position 108a in terms of manufacturing allowance.

The layer thickness of the layer region 110a between the position A1 and a position B1 may be determined in accordance with a preferred design as appropriate under the condition that the maximum concentration position 108a can be provided in a suitable position.

The inventors of the present application created a solid-state light-receiving device for ultraviolet light comprising the main portion 100 having the configuration described above, and repeatedly conducted earnest research and investigations while changing a content and content distribution of the semiconductor impurities contained in the semiconductor layer regions 103a, 104a, 109a in a great variety of ways, thereby discovering a solid-state light-receiving device for ultraviolet light free or substantially free of sensitivity and dark current deterioration even with long-term continuous irradiation of far ultraviolet light and vacuum ultraviolet light.

According to the results of the research and investigations of the inventors of the present application, the solid-state light-receiving device for ultraviolet light was confirmed to be free or substantially free of sensitivity deterioration and increases in dark current as long as the concentration of impurity atoms at the maximum concentration position 108a was $1 \times 1,019$ cm$^{-3}$ or greater.

Results clearly showed that, with this concentration, it is possible to terminate all or substantially all lines of electric force produced by a fixed charge that occurs by irradiation of far ultraviolet light and vacuum ultraviolet light and, as a result, obtain a solid-state light-receiving device for ultraviolet light that is free or substantially free of sensitivity and dark current deterioration even with long-term continuous irradiation of far ultraviolet light and vacuum ultraviolet light.

According to the results of the research and investigations of the inventors of the present application, it is clear that the characteristics described above can be further strengthened by providing the maximum concentration position 108a described above in a range of depth of within a few nm from the surface 107 of the semiconductor substrate 101.

The present invention is based on these points.

The position of the semiconductor junction 108a is preferably formed at about 50 nm to 80 nm, for example, to increase sensitivity to ultraviolet light.

However, to decrease an electric field strength of the semiconductor junction 108a to the extent possible and decrease the dark current that occurs at the semiconductor junction, the concentration of the semiconductor impurities of the semiconductor layer region 109a near the semiconductor junction 105a (2) is preferably decreased.

To avoid complexities in manufacture, the concentration of the semiconductor impurities of the semiconductor layer region 109a near the semiconductor junction 105a (2) is preferably set to $1 \times 1,017$ cm$^{-3}$ or less or $1 \times 1,015$ cm$^{-3}$ or greater. Preferably, the concentration is set to about $1 \times 1,016$ cm$^{-3}$.

The light-receiving device according to the present invention configured as described above and a conventional light-receiving device were subjected to continual irradiation for 1,500 minutes using a deuterium lamp having a light intensity of 120 μW/cm$^2$ at a light wavelength of 204 nm as a light source, and the following was confirmed.

That is, with the light-receiving device according to the present invention, neither a decrease in light sensitivity nor a decrease in dark current characteristics occurred. In contrast, with the light-receiving device set forth in Patent Document 1, the light sensitivity of the ultraviolet bandwidth (wavelength: 200 to 380 nm) deteriorated by at least 50%, and the dark current increased at least ten fold with respect to the initial value.

In the case of the present invention, it was confirmed that, even if the irradiation time were extended to 12,000 minutes, a deterioration in light sensitivity and an increase in dark current were both within a few percent and unproblematic for all practical purposes.

The solid-state light-receiving device for ultraviolet light according to the present invention, even if manufactured as a product that does not receive irradiation of far ultraviolet light or vacuum ultraviolet light, is free of deterioration of sensitivity and dark current characteristics even if irradiated by far ultraviolet light or vacuum ultraviolet light by an irresistible force, and thus, in terms of application, is not limited to a product that measures an amount of irradiated far ultraviolet light and vacuum ultraviolet light.

The following describes an example of a solid-state light-receiving device for ultraviolet light for measuring an amount of UV-A and UV-B light.

FIG. 2A is a schematic explanatory view for explaining another suitable example of a configuration of the solid-state light-receiving device for ultraviolet light according to the present invention.

In FIG. 2A, reference numerals that are the same as those in FIG. 1A are used to denote items that are the same as those in FIG. 1A.

A main portion 200 of the solid-state light-receiving device for ultraviolet light illustrated in FIG. 2A comprises a first photodiode (PD1) 200a and a second photodiode (PD2) 200b inside the semiconductor substrate 101 containing silicon (Si) as a main component.

A first layer (A1) 112a is provided on the first photodiode (PD1) 200a, and a second layer (A2) 112b is provided on the second photodiode (PD2) 200b.

The first photodiode (PD1) 200a and the second photodiode (PD2) 200b illustrated in FIG. 2A comprise the same configuration, structure, and concentration profile of semiconductor impurities as the photodiode (PD) 100a illustrated in FIG. 1A.

The photodiode (PD1) 200a comprises the layer regions 102a, 110a, 111a in a layered configuration. The photodiode (PD1) 200b comprises layer regions 102b, 110b, 111b.

The concentration profile of semiconductor impurities of the solid-state light-receiving device for ultraviolet light illustrated in FIG. 2A is shown in FIG. 2B.

Other than the descriptions of the two photodiodes, the descriptions for FIG. 2B are basically the same as those for FIG. 1A.

The first layer (A1) 112a comprises a function for selectively transmitting a light (L1) of a first wavelength region, and a function for selectively causing the light (L1) of the first wavelength region to enter a light-receiving surface (R1) of the first photodiode (PD1) by spatially covering the light-receiving surface (R1).

The second layer (A2) 112b comprises a function for selectively transmitting a light (L2) of a second wavelength region different from the light (L1) of the first wavelength region, and a function for selectively causing the light (L2) of the second wavelength region to enter a light-receiving surface (R2) of the photodiode (PD2) by spatially covering the light-receiving surface (R2).

In the solid-state light-receiving device for ultraviolet light illustrated in FIG. 2A, either one of the first wavelength region and the second wavelength region is defined as a region that does not include one or both of the wavelength regions of UV-A and UV-B, while the other is defined as a region that includes one or both of the wavelength regions of UV-A or UV-B not included in the other. Here, "includes" or "does not include" means that if the region is a slight wavelength region of an end portion of the UV-A and UV-B wavelength region, the region may be included or not included.

The first layer (A1) 112a and the second layer (A2) 112b are made of, for example, at least one element selected from the group consisting of nitrogen (N), oxygen (O), and carbon (C), and a material that contains silicon (Si) (hereinafter also expressed as "Si (N, O, C)").

The first layer (A1) 112a and the second layer (A2) 112b are preferably configured as follows when made of a material that contains "Si (N, O, C)."

That is, the first layer (A1) 112a further contains a predetermined volume (V1) of hydrogen (H) for effectively exhibiting the function for selectively transmitting the light (L1) of the first wavelength region. The second layer (A2) 112b may contain or may not contain hydrogen (H) as long as the function for selectively transmitting the light (L2) of the second wavelength region can be adequately exhibited. When the second layer (A2) 112b contains hydrogen (H), the content is generally the predetermined volume (V1) or less.

The volumes of hydrogen (H) contained in the first layer (A1) 112a and the second layer (A2) 112b are optimally selected for each layer in accordance with the types of other elements that constitute the first layer (A1) and the second layer (A2) and the composition ratios thereof. In the present invention, at least one of the types of elements other than hydrogen (H) contained in the first layer (A1) 112a and the second layer (A2) 112b and the composition ratios thereof may be the same or may be different. Nevertheless, from the viewpoints of manufacturing convenience and manufacturing cost performance, the elements contained in the first layer (A1) 112a and the second layer (A2) 112b are preferably the same types of elements with different composition ratios. While the role of hydrogen (H) contained in the first layer (A1) 112a and the second layer (A2) 112b in accurately achieving wavelength selectivity as designed in each layer remains in the realm of speculation, the effect has been experimentally confirmed. In particular, when the first layer (A1) 112a and the second layer (A2) 112b contain oxygen (O) and/or nitrogen (N), the effect of the content of hydrogen (H) in the layer is straightforward.

The first photodiode (PD1) 200a and the second photodiode (PD2) 200b are disposed inside the semiconductor substrate 101 so as to not effectively overlap three-dimensionally.

Here, "so as to not effectively overlap three-dimensionally" means that an incident surface (light-receiving surface) of the first photodiode (PD1) 200a and an incident surface (light-receiving surface) of the second photodiode (PD2) 200b do not or substantially do not overlap in a vertical direction. In other words, the range is within a permissible range that allows the output from each photodiode during light irradiation to be input to a differential circuit, and the signal output from the differential circuit as a differential signal to be regarded as a signal based on the objective ultraviolet light only.

Specifically, in the main portion 200 of the solid-state light-receiving device for ultraviolet light illustrated in FIG. 2A and FIG. 2B, the first photodiode (PD1) 200a is provided with the first layer (A1) 112a as a portion of the configuration of the main portion 200 of the light-receiving device, thereby making zero ("0") or close to "0" contributions of factor values based on the ultraviolet light of UV-A, UV-B, or the like to the output signal. That is, the output signal of the first photodiode (PD1) 200a when irradiation of sunlight is received is based on the light of a wavelength longer than that of UV-A.

On the other hand, the second photodiode (PD2) 200b is provided with a second layer (A2) 112b as a portion of the configuration of the main portion 200 of the light-receiving device, thereby contributing ultraviolet light of UV-A, UV-B, and the like as well as light in the visible light range and in a range of wavelength longer than that of the visible light range to the output signal.

In this way, in the main portion 200 of the solid-state light-receiving device for ultraviolet light in FIG. 2A, the first layer (A1) 112a and the second layer (A2) 112b are respectively provided on light-incident sides of the first photodiode (PD1) 200a and the second photodiode (PD2) 200b. The solid-state light-receiving device for ultraviolet light having such a configuration obtains a difference between the output signals of the first photodiode (PD1) 200a and the second photodiode (PD2) 200b, making it possible to suitably and efficiently extract an output signal based on the ultraviolet light of UV-A, UV-B, and the like.

The first photodiode (PD1) 200a comprises the semiconductor junction 105a (1) formed by the semiconductor layer region (1-1) 103a of the first conductive type (1) and the semiconductor layer region (1-2) 104a of the second conductive type (2) having a polarity that differs from that of the first conductive type (1) and is provided on the semiconductor layer region (1-1) 103a.

The second photodiode (PD2) 200b comprises a semiconductor junction 105b (1) formed by a semiconductor layer region (2-2) 104b of the second conductive type (2) having a polarity that differs from that of the first conductive type (1) and is provided on a semiconductor layer region (2-1) 103b of the first conductive type (1).

The photodiode in the present invention comprises a semiconductor junction formed by bringing two semiconductor layer regions differing in polarity into direct contact with one another in this way. In the layer region of the junction of two semiconductors differing in polarity, an expanse of a depletion layer that produces adequate photocurrent is formed. Here, the semiconductor junction is not limited to one, and the photodiode may comprise a layer region having a plurality of semiconductor junctions.

The semiconductor layer region (1-1) 103a contains the semiconductor impurities (1) for imparting the first conductive type (1). The concentration of the semiconductor impurities (1) is distributed in the layer thickness direction of the semiconductor layer region (1-1) 103a. The maximum concentration position (1-1) 106a is provided in the layer thickness direction in the distribution of the concentration of the semiconductor impurities (1).

The semiconductor layer region (2-1) 103b contains semiconductor impurities (2) for imparting the second conductive type (2). The concentration of the semiconductor impurities (2) is distributed in the layer thickness direction of the semiconductor layer region (2-1) 103b. A maximum concentration position (2-1) 106b is provided in the layer thickness direction in the distribution of the concentration of the semiconductor impurities (2).

In FIG. 2A, the maximum concentration position (1-1) 106a and the maximum concentration position (2-1) 106b are preferably the same or substantially the same in depth direction (D) from the position of the surface 107 of the semiconductor substrate 101. Aligning the maximum concentration positions makes it possible to equally or substantially equally align the sensitivity characteristics of the photodiode (PD1) 200a and the photodiode (PD2) 200b. A design in which the maximum concentration position (1-1) 106a and the maximum concentration position (2-1) 106b are intentionally in different positions is also preferred from the viewpoint of achieving freedom in designing the photodiode (PD1) 200a and the photodiode (PD2) 200b. Nevertheless, more preferably, the maximum concentration position (1-1) 106a and the maximum concentration position (2-1) 106b are the same or substantially the same position, and the concentration (1) of the impurities in the maximum concentration position (1-1) 106a and the concentration (2) of the impurities in the maximum concentration position (2-1) 106b are the same or substantially the same. Here, "substantially the same" means that substantially the same effect is achieved as that when the maximum concentration position (1-1) 106a and the maximum concentration position (2-1) 106b are the same in the depth direction (D) from the surface 107 of the semiconductor substrate 101.

The semiconductor layer region (1-3) 109a of the conductive type (1) is provided on the semiconductor layer region (1-2) 104a. In the semiconductor layer region (1-3) 109a, the concentration of the semiconductor impurities is distributed in the layer thickness direction and the maximum concentration position (1-2) 108a in the concentration distribution of the semiconductor impurities is provided.

A semiconductor layer region (2-3) 109b of the conductive type (1) is provided on the semiconductor layer region (2-2) 104b. In the semiconductor layer region (2-3) 109b, the concentration of the semiconductor impurities is distributed in the layer thickness direction and a maximum concentration position (2-2) 108b in the concentration distribution of the semiconductor impurities is provided.

The maximum concentration position (1-2) 108a and the maximum concentration position (2-2) 108b are preferably in the same or substantially the same position in the depth direction (D) from the position of the surface 107 of the semiconductor substrate 101. Here, "substantially the same" means a range in a technical sense that includes being within the tolerance range of manufacturing precision.

In the main portion 200 of the light-receiving device illustrated in FIG. 2A, the maximum concentration position (1-2) 108a is in the same depth position as the maximum concentration position (2-2) 108b.

The semiconductor layer region (1-3) 109a includes the maximum concentration position (1-2) 108a in an upward portion thereof, and comprises the layer region 111a having a thickness d1 (the thickness from a position of the surface 107 of the semiconductor substrate to a position A1 in the depth direction) regarded as free or effectively free of absorption of UV-A and UV-B light.

In FIG. 2A, the position A1 does not hinder design, even if the same as the position of the maximum concentration position (1-2) 108a. Nevertheless, if the thickness d1 regarded as free or effectively free of absorption of UV-A and UV-B light is to be maintained, the position A1 is preferably below the maximum concentration position (1-2) 108a in terms of manufacturing allowance.

The layer thickness of the layer region (B1) 110a between the position A1 and the position B1 may be determined in accordance with a preferred design as appropriate under the condition that the maximum concentration position (1-2) 108a can be provided in a suitable position.

The semiconductor layer region (2-3) 109b comprises the maximum concentration position (2-2) 108b inside the layer region (A2) 111b having a thickness d2 (the thickness from a position of the surface 107 of the semiconductor substrate 101 to a position A2 in the depth direction) regarded as free or effectively free of absorption of UV-A and UV-B light, in an upper portion thereof.

The thickness d2 is decreased to the extent possible in a range in which the maximum concentration position (2-2) 108B can be provided, thereby making it possible to substantially eliminate absorption of the UV-A and UV-B light inside the layer region (A2) 111*b* having the thickness d2. That is, the effect of irradiation of UV-A and UV-B inside the layer region (A2) 111*b* is non-existent or suppressed to the extent of being negligible.

The layer thickness of the layer region 110*b* between the position A1 and the position B1 may be determined in accordance with a preferred design as appropriate under the condition that the maximum concentration position (2-2) 108*b* can be provided in a suitable position. In a suitable embodiment of the present invention, the position A1 and the position A2, and the position B1 and a position B2 are preferably the same or substantially the same, respectively.

The layer thickness of the layer region 110*a* and the layer thickness of the layer region 110*b* are preferably determined as appropriate in accordance with design preferences so as to satisfy the conditions described above. Specifically, the layer thickness of the layer region 110*a* and the layer thickness of the layer region 110*b* are preferably 6 nm or less, and more preferably 2 nm or less.

The first layer (A1) 112*a* and the second layer (A2) 112*b* are arranged in parallel on the surface 107 of the semiconductor substrate via an intermediate layer 113.

When the first layer (A1) 112*a* and the second layer (A2) 112*b* are provided directly on the surface 107 of the semiconductor substrate, in many cases a great number of interface states are formed on the interface thereof (contact surface between the surface 107 and "the first layer (A1) 112*a* and the second layer (A2) 112*b*"), causing the occurrence of dark current. Further, this also leads to reconnection of the light charge at the interface, resulting in a decrease in light sensitivity. To avoid such circumstances, the intermediate layer 113 is provided on the surface 107 of the semiconductor substrate, and the layer (A1) 112*a* and the layer (A2) 112*b* are provided on the intermediate layer 113. The intermediate layer 113 is made of a material having adequate transparency with respect at least UV-A and UV-B light. Examples of such a material include silicon oxide and silicon oxynitride. Preferably, for example, the intermediate layer 113 is made of silicon dioxide (SiO2) and nitrogen (N) containing silicon dioxide ("SiO2 (N)").

The first layer (A1) 112*a* is provided so as to fully spatially cover the light-receiving surface (incident surface) of the first photodiode (PD1) 200*a*, and cause only the light that is transmitted through the first layer (A1) to enter the light-receiving surface of the first photodiode (PD1) 200*a*. Similarly, the second layer (A2) 112*b* is provided so as to fully spatially cover the light-receiving surface (incident surface) of the second photodiode (PD2) 200*b*, and cause only the light that is transmitted through the second layer (A2) to enter the light-receiving surface of the second photodiode (PD2) 200*b*. The first layer (A1) 112*a* and the second layer (A2) 112*b* each have a function for selectively transmitting light. In the present invention, the first layer (A1) 112*a* absorbs UV-A and UV-B light, and thus has a function for blocking or substantially blocking entry of UV-A and UV-B light to the first photodiode (PD1) 200*a*. On the other hand, the second layer (A2) 112*b* adequately transmits UV-A and UV-B light, and thus has a function for not obstructing or substantially not obstructing entry of UV-A and UV-B light to the second photodiode (PD2) 200*b*. The first layer (A1) 112*a* and the second layer (A2) 112*b* may each be provided in a state of horizontal contact with a symmetrical axis between the first photodiode (PD1) 200*a* and the second photodiode (PD2) 200*b*, or may be provided with layer regions 114*a*, 114*b*, 114*c* for demarcation as illustrated in FIG. 2A. The layer regions 114*a*, 114*b*, 114*c* are preferably made of the same material as the intermediate layer 113 so as to allow formation using the same process as the intermediate layer 113.

While FIG. 2A illustrates an example in which the maximum concentration position (2-2) 108*b* is provided in the interior of the layer region (A2) 111*b*, the maximum concentration position (2-2) 108*b* may be provided in a position equivalent to that of the surface 107. In the present invention, the layer region (B2) 110*b* between the position A2 and the position B2 does not necessarily need to be provided, and may be omitted in design depending on the characteristics and performance of the light-receiving device.

With the semiconductor layer region (2-3) 109*b* configured as described above, it is possible to make the impact of the irradiation of UV-A and UV-B light on the output of the photodiode (PD2) 102*b* irradiated with sunlight more effective.

Positions C1 and C2, positions D1 and D2, and positions E1 and E2 of the photodiode (PD1) 200*a* and the photodiode (PD2) 200*b* are preferably equal or substantially equal positions.

With such a positional relationship between each position, it is possible to more suitably measure the amount and intensity of UV-A and UV-B light.

In the present invention, a passivation film (or protective film) may be provided on a topmost surface on a light-incident side of main portions 100, 200 of the light-receiving device in a predetermined thickness using insulating materials such as SiO2, SiN, and SiCN for the purpose of mechanical protection.

In the present invention, the main portions 100, 200 of the light-receiving device are configured as described above, making it possible to select a thickness of the passivation film as desired without taking into consideration an effect of interference caused by film thickness.

It should be noted that a semiconductor impurity concentration value (A) is indicated as an absolute value of the difference between the semiconductor impurity concentration value of the first conductive type (1) and the semiconductor impurity concentration value of the second conductive type (2) in a layer region where the semiconductor impurities of the first conductive type (1) and the second conductive type (2) are mixed. Hereinafter, this point is the same in descriptions of similar profiles.

FIG. 3 schematically illustrates a basic structure of the solid-state light-receiving device for ultraviolet light according to the present invention.

In reference to FIG. 3, a solid-state light-receiving device 400 for ultraviolet light comprises a photodiode (1) 402*a*, a photodiode (2) 402*b*, and a differential circuit 403 formed inside a semiconductor substrate 401 containing silicon (Si) as a main component.

In FIG. 3, a signal (1) based on an output of the photodiode (1) 402*a* is input to a negative terminal of the differential circuit 403 via a line 404*a*. A signal (2) based on an output of the photodiode (2) 402*b* is input to a positive terminal of the differential circuit 403 via a line 404*b*.

When the signal (1) and the signal (2) are input to the differential circuit 403, a differential signal (3) is output from an output terminal 405.

While the differential circuit 403, if provided with a differential function, may comprise or may not comprise an amplifier function, the differential circuit 403 preferably comprises the amplifier function. Further, the differential circuit 403 may be integrally formed with the photodiodes in the semiconductor substrate 401. Furthermore, the differential circuit 403 may be formed on another semiconductor substrate and mounted on a third substrate along with the semiconductor substrate 401 where the photodiodes are formed.

FIG. 4 illustrates a schematically top view of an example of a layout of a light-incident surface of a main portion 500 of a solid-state light-receiving device for ultraviolet light according to the present invention having the same structure as that in FIG. 2A.

The example in FIG. 4 illustrates the simplest configuration of a one-pair photodiode type in which one each of a first photodiode (PD1) 501a and a second photodiode (PD2) 501b are planarly provided. A light-receiving surface of each of the photodiodes has a rectangular shape.

FIG. 5 illustrates an example in which a light-incident surface of eight first photodiodes (PD1) 601a and eight second photodiodes (PD2) 601b is arranged in a checkered pattern. In this way, a plurality of the first photodiodes (PD1) 601a and a plurality of the second photodiodes (PD2) 601b in the present invention are arranged in identical quantities, making it possible to decrease individual differences in the manufacture of the photodiodes.

Embodiment of manufacture of main portion of solid-state light-receiving device for ultraviolet light Next, a suitable manufacturing example of a main portion of a light-receiving device having a p+np device structure will be described. Further, the device structure according to the present invention is not limited to that of the p+np device, and naturally, in the technical field, a structure having a polarity opposite that of the device structure is included in the category of the present invention.

The light-receiving device according to the present invention may be formed by a conventional semiconductor manufacturing technique. Accordingly, in the following step descriptions, matters that are self-evident for a technician in the field are omitted and the main points are simply described.

(Step 1): An Si wafer (semiconductor substrate) is prepared. Here, a p-type Si wafer having a p-type impurity concentration of $1\times1,016$ cm$^{-3}$ is prepared. Needless to say, however, an n-type Si wafer having an n-type impurity concentration of $1\times1,016$ cm$^{-3}$ may be used.

(Step 2): A 7-nm SiO2 film is formed on the semiconductor substrate (p-type Si wafer) surface. Here, hydroxylation at 750° C. is performed.

(Step 3): Ion implantation for forming a p-type well that will serve as semiconductor layer regions (1-1) and (2-1) is performed using the same process conditions. To ensure that the maximum concentration positions (1-1) and (1-2) are 500 nm, the ion implantation conditions for p-type well formation include setting the ion species to B+, the implantation energy to 150 keV, and the dose to $1.0\times1,013$ cm$^{-2}$.

(Step 4): Heat treatment is performed to activate the impurity atoms implanted in (Step 3). Here, heat treatment at 900° C. is performed for 30 minutes in a nitrogen atmosphere.

(Step 5): Ion implantation for forming semiconductor layer regions (1-2) and (2-2) is performed using the same process conditions. To ensure that the semiconductor junction position is about 300 nm, the ion implantation conditions include setting the ion species to P+, the implantation energy to 120 keV, and the dose to $1.5\times1,013$ cm$^{-2}$.

(Step 6): Ion implantation for forming the semiconductor layer region (1-3) of the first photodiode (1) and the semiconductor layer region (2-3) of the second photodiode (2) is performed using the same process conditions. Here, to ensure that the maximum concentration positions (1-2) and (2-2) are 1 nm and the impurity concentration is $1\times1,019$ cm$^{-3}$ or greater in a range from the surface of the Si semiconductor substrate to approximately 5 nm, the ion species is set to BF2+, the implantation energy is set to 9 keV, and the dose is set to $1.0\times1,014$ cm$^{-2}$.

(Step 7): To extract the light charge from the semiconductor layer regions (1-2) and (2-2), ion implantation for forming a high-concentration n-type impurity layer in a region of a portion of each of the semiconductor layer regions (1-2) and the semiconductor layer region (2-2) is performed.

The ion species is set to As+, the implantation energy is set to 40 keV, and the dose is set to $5\times1,015$ cm$^{-2}$.

(Step 8): To extract the light charge from the semiconductor layer regions (1-1) and (2-1), ion implantation for forming a high-concentration p-type impurity layer in a region of a portion of each of the semiconductor layer regions (1-1) and the semiconductor layer region (2-1) is performed. The ion species is set to BF2+, the implantation energy is set to 40 keV, and the dose is set to $5\times1,015$ cm$^{-2}$.

(Step 9): Heat treatment is performed to activate the implanted impurity atoms. Here, heat treatment at 1,000° C. is performed for 5 seconds in a nitrogen atmosphere.

(Step 10): An insulating film between wiring layers is formed. Here, a SiO2 film having a thickness of 1300 nm is formed using a chemical vapor disposition method.

(Step 11): The first layer (A1) that selectively transmits the light of the first wavelength region and spatially covers the light-receiving surface of the first photodiode (PD1) is formed. Thus, a SiN film is formed at a thickness of 400 nm using a plasma chemical vapor disposition method. Here, film formation using microwave excitation plasma will be described. A pressure during film formation is set to 12.7 mTorr, a plasma excitation microwave power is set to 2,000 W, and a stage temperature is set to 400° C. Process gases used for film formation are Ar, N2, SiH4, and H2, and the respective gas flow rates are set to 20 sccm, 75 sccm, 3.0 sccm, and 30 sccm in order to increase the amount of H contained in the SiN film.

(Step 12): The second layer (A2) that selectively transmits the light of the second wavelength region and spatially covers the light-receiving surface of the second photodiode (PD2) is formed. Thus, a SiN film is formed at a thickness of 400 nm using a chemical vapor disposition method. Here, film formation using microwave excitation plasma will be described. The pressure during film formation is set to 12.7 mTorr, the plasma excitation microwave power is set to 2,000 W, and the stage temperature is set to 400° C. The processes gases used for film formation are Ar, N2, SiH4, and H2, and the respective gas flow rates are set to 20 sccm, 75 sccm, 0.5 sccm, and 15 sccm in order to decrease the amount of H contained in the SiN film compared to the amount contained in the first layer (A1) that selectively transmits the light of the first wavelength region and spatially covers the light-receiving surface of the first photodiode (PD1). Here, in film formation of the first layer (A1) and the second layer (A2), the ratios of the components of the process gases for film formation are changed in order to set the absorption end wavelength of light to about 380 nm in the first layer (A1) and 200 nm in the second layer (A2). However, because a refractive index and a film thickness are equal, wavelength dependencies on the transmission characteristics of incident light caused by light interference are equal. As a result, an error when the difference between the signal (1) based on the output of the first photodiode (PD1) and the signal (2) based on the output of the second photodiode (PD2) is obtained decreases.

(Step 13): A contact hole is formed to connect the wiring and the high-concentration n-type impurity layer as well as the high-concentration p-type impurity layer. Here, the insulating film between wiring layers is etched by dry etching.
(Step 14): To form the A1 wiring, an A1 film having a thickness of 700 nm is formed using a sputtering method.
(Step 15): To form the A1 wiring, etching and patterning are performed on a portion of the A1 region by dry etching.
(Step 16): To perform hydrogen sintering, heat treatment at 400° C. is performed in a nitrogen atmosphere containing 10% hydrogen.

With the example of the solid-state light-receiving device for ultraviolet light according to the present invention created as described above, it was found that it is possible to suppress an accumulation of relative light sensitivity of light having a wavelength of 380 nm or greater to within a few percent with respect to an accumulation of light of all wavelengths, and accurately measure the harmful ultraviolet light. The results are described using FIGS. 6 to 10.

FIG. 6 is a graph showing the transmission characteristics of light that enters the first photodiode (PD1) and the second photodiode (PD2).

G1 indicates the transmittance of light that enters the first photodiode, and G2 indicates the transmittance of light that enters the second photodiode.

FIG. 7 is a graph showing a relative light-receiving sensitivity of the first photodiode (PD1), the second photodiode (PD2), and the light-receiving device according to the present invention into which these photodiodes are incorporated.

G1 indicates the graph of the first photodiode, G2 indicates the graph of the second photodiode, and G3 indicates the graph of the solid-state light-receiving device for ultraviolet light.

FIG. 8 is a graph showing a spectrum of sunlight that shines down on the ground.

FIG. 9 is a graph showing a relative spectrum output of the light-receiving device according to the present invention taking into consideration FIG. 8.

As understood from FIG. 9, the percentage of output having a light wavelength of 280 to 380 nm with respect to an integral value of the output of all light wavelengths is 96%. While, in the above embodiment, the present invention has been described using an example in which there are two photodiodes (PD), the present invention is not limited thereto. According to the present invention, the amount and the intensity of ultraviolet light can be measured more accurately by dividing the harmful ultraviolet light regions into three or more classifications and using a quantity of photodiodes (PD) equivalent to the number of classifications.

Next, an example of an embodiment that uses three photodiodes (PD) will be described. FIG. 10 illustrates a main portion 1000 of the light-receiving device.

The main portion 1000 of the light-receiving device comprises three photodiodes (PDs) including a first photodiode (PD1) 1002a, a second photodiode (PD2) 1002b, and a third photodiode (PD3) 1002c inside a semiconductor substrate 1001. Further, the main portion 1000 of the light-receiving device comprises three differential circuits 1003a, 1003b, 1003c.

While the differential circuits 1003a, 1003b, 1003c, if provided with a differential function, may comprise or may not comprise an amplification function, the differential circuits 1003a, 1003b, 1003c preferably comprise the amplification function. Further, the differential circuits 1003a, 1003b, 1003c may be integrally formed along with the photodiodes (PD) in the semiconductor substrate 1001. Furthermore, the differential circuits 1003a, 1003b, 1003c may be formed on another semiconductor substrate and mounted on a third substrate along with the semiconductor substrate 1001 where the photodiodes (PD) are formed.

The following describes an example in which "(UV-A)+(UV-B)" information, "(UV-A)" information, and "UV-B" information are obtained using the light-receiving device illustrated in FIG. 10.

In FIG. 10, a signal (1) based on an output of the first photodiode (PD1) 1002a is input to a negative terminal of the differential circuit 1003c and a negative terminal of the differential circuit 1003b via a line 1004a. A signal (2) based on an output of the photodiode (PD2) 1002b is input to a positive terminal of the differential circuit 1003a and a positive terminal of the differential circuit 1003c via a line 1004b. A signal (3) based on an output of the photodiode (PD3) 1002c is input to a positive terminal of the differential circuit 1003b and a negative terminal of the differential circuit 1003c via a line 1004c.

When the signal (1) and the signal (2) are input to the differential circuit 1003c, a differential signal (1) is output from an output terminal 1005c. This differential signal (1) includes the "(UV-A)+(UV-B)" information. When the signal (1) and the signal (3) are input to the differential circuit 1003b, a differential signal (2) is output from an output terminal 1005b. This differential signal (2) includes the "(UV-A)" information. When the signal (2) and the signal (3) are input to the differential circuit 1003a, a differential signal (3) is output from an output terminal 1005a. This differential signal (3) includes the "(UV-B)" information.

FIG. 11 schematically illustrates a top view of an example of a layout of a light-incident surface of a main portion 1100 of a solid-state light-receiving device for ultraviolet light having a structure in which 12 pairs of main portions of a solid-state light-receiving device for ultraviolet light having a three photodiode (PD) structure similar to that in FIG. 10 are disposed.

A first photodiode (PD1) 1101a, a second photodiode (PD2) 1101b, and a third photodiode (PD3) 1101c are each disposed so that photodiodes (PD) of the same type are not adjacent in a matrix.

Next, a manufacturing example of the main portion of the light-receiving device illustrated in FIG. 10 will be described. Further, the device structure according to the present invention is not limited to that of the p+np device, and naturally, in the technical field, a structure having a polarity opposite that of the device structure is included in the category of the present invention.

The light-receiving device illustrated in FIG. 10 may also be formed using a conventional semiconductor manufacturing technique in the same manner as the light-receiving device in FIG. 3. Accordingly, in the following step descriptions, matters that are self-evident for a technician in the field are omitted and the main points are simply described.

Here, the methods for forming a PN junction portion of the photodiodes and the first layer (A1) and the second layer (A2) that selectively transmit light are the same methods as described above and therefore omitted, and only the method for forming a third layer (A3) that selectively transmits the light of the third wavelength region and spatially covers the light-receiving portion of a third photodiode (PD3) 1002c will be described.

The following simply describes the steps and conditions for forming the third layer (A3) that selectively transmits the light of the third wavelength region and spatially covers the light-receiving surface of the third photodiode (PD3) 1002c.

First, an intermediate layer is provided using SiO2, and then a SiN film having a thickness of 400 nm is formed using a chemical vapor disposition method. Here, as an example of film formation, film formation using microwave excitation plasma will be described.

The conditions for film formation using microwave excitation plasma in the present invention include, for example, setting the pressure during film formation to 12.7 mTorr, the microwave power for plasma excitation to 2,000 W, and the stage temperature to 400° C. The process gasses used for film formation are Ar, N2, SiH4, and H2, and the respective gas flow rates are set to 20 sccm, 75 sccm, 1.0 sccm, and 30 sccm to ensure that the amount of H contained in the SiN film is small compared to the amount contained in the first layer (A1) that selectively transmits light of the first wavelength region and spatially covers the light-receiving surface of the first photodiode (PD1), and large compared to the amount contained in the second layer (A2) that selectively transmits light of the second wavelength region and spatially covers the light-receiving surface of the second photodiode (PD2).

Here, in film formation of the first layer (A1) and the second layer (A2), the ratios of the components of the process gases for film formation are changed in order to set the absorption end wavelength of light to about 380 nm in the first layer (A1), 200 nm in the second layer (A2), and 315 nm in the third layer (A3). However, because the refractive index and the film thickness are equal, wavelength dependencies on the transmission characteristics of incident light caused by light interference are equal. As a result, an error when the difference between the signal (1) based on the output of the first photodiode (PD1), the signal (2) based on the output of the second photodiode (PD2), and the signal (3) based on the output of the third photodiode (PD3) is obtained decreases.

Using the difference between the signal (1) based on the output of the first photodiode (PD1) and the signal (2) based on the output of the second photodiode (PD2), a signal of light in the wavelength bandwidth of 200 to 380 nm is obtained. Using the difference between the signal (3) based on the output of the third photodiode (PD3) and the signal (1) based on the output of the first photodiode (PD1), a signal of light in the wavelength bandwidth of 315 to 380 nm is obtained. Using the difference between the signal (2) based on the output of the second photodiode (PD2) and the signal (3) based on the output of the third photodiode (PD3), a signal of light in the wavelength bandwidth of 200 to 315 nm is obtained.

With the example of the solid-state light-receiving device for ultraviolet light according to the present invention created as described above, it was found that it is possible to detect the light intensities of the light wavelength bandwidths of UV-A and UV-B and the light intensities of UV-A and UV-B, respectively, and accurately measure a UV index that serves as an indicator for imparting an adverse effect on the human body. The results are described using FIGS. 12 to 14.

FIG. 12 is a graph showing the transmission characteristics of light that enters the first photodiode (PD1), the second photodiode (PD2), and the third photodiode (PD3).

G1 indicates the transmittance of light that enters the first photodiode, G2 indicates the transmittance of the light that enters the second photodiode, and G3 indicates the transmittance of the light that enters the third photodiode.

FIG. 13 is a graph showing a relative light-receiving sensitivity of output of the difference between a signal (3) based on an output of the third photodiode (PD3), taking into consideration the spectrum of sunlight that shines down on the ground shown in FIG. 8, and a signal (2) based on an output of the second photodiode (PD2). The relative output with respect to the light wavelength bandwidth of UV-A is thus obtained.

FIG. 14 is a graph showing a relative light-receiving sensitivity of output of the difference between the signal (2) based on the output of the second photodiode (PD2), taking into consideration the spectrum of sunlight that shines down on the ground shown in FIG. 8, and the signal (3) based on the output of the third photodiode (PD3). The relative output with respect to the light wavelength bandwidth of UV-B is thus obtained.

With the example of the solid-state light-receiving device for ultraviolet light according to the present invention created as described above, it was found that it is possible to suppress the accumulation of the relative light sensitivity of light having a wavelength of 380 nm or greater to within a few percent with respect to the accumulation of light of all wavelengths, and accurately measure the harmful ultraviolet light. The results are described using FIGS. 8 to 10.

FIG. 8 is a graph showing a relative light-receiving sensitivity of the first photodiode (1), the second photodiode (2), and the light-receiving device according to the present invention into which these photodiodes are incorporated.

FIG. 9 is a graph showing a spectrum of sunlight that shines down on the ground.

FIG. 10 is a graph showing a relative spectrum output of the light-receiving device according to the present invention taking into consideration FIG. 9.

(A) First photodiode (1)
   Maximum concentration position (1-1)=565 nm
   Maximum concentration position (1-2)=30 nm (B) Second photodiode (2)
   Maximum concentration position (2-1)=500 nm
   Maximum concentration position (2-2)=1 nm As understood from FIG. 10, the percentage of output (shaded area) having a light wavelength of 280 to 380 nm with respect to an integral value of the output of all light wavelengths was 96%.

While the present invention has been described using an example of UV-A and UV-B thus far, the present invention is not limited thereto and, needless to say, may be realized for ultraviolet rays such as UV-C, for example, having a wavelength shorter than that of UV-B.

The following describes an embodiment of a suitable application example of the solid-state light-receiving device for ultraviolet light according to the present invention.

FIG. 15A and FIG. 15B are outline configuration views illustrating an embodiment when the present invention is applied to a mobile terminal device. FIG. 15A is an outline external view, and FIG. 15B is a block diagram of an internal configuration.

A mobile terminal device 701 illustrated in FIG. 15A and FIG. 15B comprises a global positioning system (GPS) positioning portion 703, a calculation processing portion 704, a storage device 705, and a display unit 706.

Examples of the mobile terminal device 701 include a mobile electronic device such as a mobile telephone device having a navigation function, a personal digital assistant (PDA), a tablet, or a mobile PC, and a wearable article such as a wristwatch, a scouter, a necklace, or a ring having an electronic device function, or a sunvisor. Furthermore, utilizing the advantages of the light-receiving device for ultraviolet rays according to the present invention, including ultra-small size and low cost, it is possible to incorporate the light-receiving device for ultraviolet light into a compact for cosmetics, a hand mirror, or the like for commercialization.

The GPS positioning portion 703 functions as a first current position calculating portion that receives a position information signal sent from a satellite 702 and identifies a current position.

The calculation processing portion 704 receives detection signals of a vertical acceleration sensor 708 that detects a number of steps and an angular velocity sensor 709 that detects a direction, autonomously identifies the current position based on these, and executes navigation processing.

The calculation processing portion 704 comprises a microcomputer, a central processing unit (CPU), and the like.

The storage device 705 comprises a ROM 705*a* that stores a processing program executed by the calculation processing portion 704 and stores a storage table required in calculation processing, a RAM 705*b* that stores calculation results and the like required in calculation processing, and a non-volatile memory 705*c* that stores the current position information when navigation processing ends.

The display unit 706 displays navigation image information output from the calculation processing portion 704, and therefore comprises a liquid crystal display unit, an organic EL display unit, or the like.

A clock portion 707 displays a year, month, day, and time corrected using the current time information that indicates the year, month, day, and time output from the GPS positioning portion 703 when the GPS positioning portion 703 is activated.

The calculation processing portion 704 receives the current position information output from the GPS positioning portion 703, the current time information that indicates the year, month, day, and time output from the clock portion 707, the acceleration information output from the acceleration sensor 708 mounted on a hip position of the user that retains the mobile terminal device 701, the angular velocity information corresponding to the direction of the walking by the user and output from the angular velocity sensor 709, such as a gyroscope, mounted to the mobile terminal device 701, and ultraviolet intensity information output from an ultraviolet sensor (solid-state light-receiving device for ultraviolet light) 710 serving as ultraviolet ray detecting means for measuring the intensity of ultraviolet rays irradiated onto the mobile terminal device 701.

A communication portion 711 that performs wireless communication with an external wireless communication device is connected to the calculation processing portion 704.

The ROM 705*a* stores a storage table of position information by region, and a UV index threshold value storage table that sets the threshold values of the UV index indicating the ultraviolet intensity for the months of one year per region.

In addition, the ROM 705*a* stores a day/night assessment processing program for calculating sunrise and sunset times that serve as day/night boundaries and references for determining whether or not the ultraviolet intensity detected by the ultraviolet sensor 710 is effective, a UV index threshold calculation program for calculating a UV index threshold THuv that similarly serves as a reference for determining whether or not the ultraviolet intensity is effective, an autonomous positioning calculation program for performing autonomous positioning calculations, and a calculation portion selection processing program for selecting either the current position information calculated by the GPS positioning portion 703 or the current position information calculated by the autonomous positioning calculation processing based on the autonomous positioning program.

The storage table of position information by region charts the names of prefectures across the country, the names of the capitals of each prefecture, and the latitude (N) and the longitude (E) of each capital.

The UV index threshold value storage table sets the monthly threshold values THuv of the UV index divided into three groups (January to April, May to August, and September to December) for the Japanese islands divided into four regions, that is, Sapporo, Tsukuba, Kagoshima, and Naha.

While the threshold value THuv of the UV index is constant regardless of latitude from May to August, the threshold value THuv of the UV index is set so as to decrease as the latitude increases from January to April and from September to December.

Further, the calculation processing portion 704 executes the day/night assessment processing and the UV index threshold value calculation processing, which serve as a reference for determining whether or not the ultraviolet intensity is effective in accordance with the day/night assessment processing program.

This UV index threshold value calculation processing first determines whether or not current position information has been generated by the GPS positioning portion 703. When the current position information has been generated by the GPS positioning portion 703, the UV index threshold value calculation processing reads the current position information calculated by the GPS positioning portion 703, and determines if the region associated with the current position is affiliated with any of the four regions of Sapporo, Tsukuba, Kagoshima, and Naha.

Next, the calculation processing portion 704 reads the month information from the clock portion 707, calculates the UV index threshold value THuv with reference to the UV index threshold value storage table on the basis of the determined region among the four regions and month information, and ends UV index threshold value calculation processing.

Furthermore, the calculation processing portion 704 executes the autonomous positioning calculation processing in accordance with the autonomous positioning calculation program that performs autonomous positioning calculations.

This autonomous positioning calculation processing is started when autonomous calculation processing is selected by the calculation portion selection processing and, once the previous current position identified by the GPS positioning portion 703 is set as the initial position in the initial state, is executed as timer interrupt processing every predetermined time period (10 msec, for example) with respect to a predetermined main program. That is, first the autonomous positioning calculation processing reads an angular velocity θv detected by the angular velocity sensor 709, then integrates the angular velocity θv, calculates the direction θ, and transitions to the next step.

Next, the autonomous positioning calculation processing reads a vertical acceleration G detected by the acceleration sensor 708, calculates a number of steps P from a change pattern of the vertical acceleration G, multiplies a pace width W set in advance by the calculated number of steps P to calculate a moved distance L, updates the current position information on the basis of the calculated direction θ and the moved distance L, displays the updated current position information on the display unit 706 over map information, ends the timer interrupt processing, and returns to the predetermined main program.

Furthermore, the calculation processing portion 704 executes calculation portion selection processing that selects either the current position information identified by the GPS positioning portion 703 in accordance with the calculation portion selection processing program or the current position information identified by the autonomous positioning calculation processing.

According to this calculation portion selection processing, execution is started when the navigation processing is selected on the mobile terminal device 701 after power ON, and the calculation portion selection processing is executed.

The solid-state light-receiving device for ultraviolet light according to the present invention, utilizing the small-size and light-weight characteristics thereof, can be easily incorporated into the information terminal devices given above as well as a compact serving as a tool for cosmetics, a mobile navigation device, a drive recorder, a mobile pressure gauge or height difference gauge for mountain climbing, a stop watch, and the like.

DESCRIPTIONS OF REFERENCE NUMERALS 100, 500, 600, 1100 Main portion of solid-state light-receiving device for ultraviolet light
100, 200, 400, 500, 600, 1000, 1100 Solid-state light-receiving device for ultraviolet light
100a Photodiode (PD)
101, 401, 1001 Semiconductor substrate
200a, 400a, 501a, 601a, 1002a, 1101a First photodiode (PD1)
200b, 400b, 501b, 601b, 1002b, 1101b Second photodiode (PD2)
1101c Third photodiode (PD3)
103a Semiconductor layer region (1-1)
103b Semiconductor layer region (2-1)
104a Semiconductor layer region (1-2)
104b Semiconductor layer region (2-2)
105a (1), 105b (1) Semiconductor junction (1)
105a (2), 105b (2) Semiconductor junction (2)
106a Maximum concentration position (1-1)
106b Maximum concentration position (2-1)
107 Surface
108a Maximum concentration position (1-2)
108b Maximum concentration position (2-2)
109a Semiconductor layer region (1-3)
109b Semiconductor layer region (2-3)
110a Layer region (A1)
110b Layer region (A2)
111a Layer region (B1)
111b Layer region (B2)
403, 1003a, 1003b, 1003c Differential circuit
404a, 404b, 1004a, 1004b, 1004c Line
405, 1005a, 1005b, 1005c Output terminal
701 Mobile terminal device
702 Satellite
703 GPS positioning portion
704 Calculation processing portion
705 Storage device
705a ROM
705b RAM
705c Non-volatile memory
706 Display unit
707 Clock portion
708 Acceleration sensor
709 Angular velocity sensor
710 Ultraviolet sensor (solid-state light-receiving device for ultraviolet light)
711 Communication portion
1002c Third photodiode (PD3)

What is claimed is:

1. A solid-state light-receiving device for ultraviolet light, comprising:

a semiconductor substrate containing silicon as a main component, and a photodiode formed inside the semiconductor substrate;

the photodiode having, from a rear surface side of the substrate, a layered configuration comprising a first semiconductor region of a first conductive type, a second semiconductor region of a second conductive type different from the first conductive type and forming a semiconductor coupling with the first semiconductor region, and a third semiconductor region of the first conductive type provided on the second semiconductor region, the second and third semiconductor regions forming a semiconductor junction;

the second semiconductor region containing semiconductor impurities of the second conductive type; and a content concentration distribution of the impurities in a depth direction from a light-incident side surface of the third semiconductor region having a maximum concentration position in a layer region between the incident side surface and a depth position at which light absorption of UV-A and UV-B light is zero or effectively zero, wherein the concentration of the impurities at the maximum concentration position is at least $1 \times 10^{19}/\text{cm}^3$ where all or substantially all lines of electric force that occur by a fixed charge produced by irradiation of far ultraviolet light terminate.

2. The solid-state light-receiving device for ultraviolet light according to claim 1, wherein the semiconductor junction between the second and third semiconductor regions is formed at a position between about 50 to about 80 nm from the incident side surface so as to increase sensitivity to ultraviolet light, and the concentration of the impurities around the junction position of the semiconductor junction is at most $1 \times 10^{17}/\text{cm}^3$ so as to suppress generation of dark current.

3. An electronic device comprising the solid-state light-receiving device for ultraviolet light according to claim 1.

4. The electronic device according to claim 3, further comprising a communication function.

5. An electronic device comprising the solid-state light-receiving device for ultraviolet light according to claim 2.

6. The electronic device according to claim 5, further comprising a communication function.

7. A solid-state light-receiving device for ultraviolet light, comprising:

a semiconductor substrate containing silicon as a main component, a first photodiode and a second photodiode disposed inside the semiconductor substrate so as to not effectively overlap three-dimensionally, and a differential signal processor adapted to receive a first signal on the basis of a first output of the first photodiode and a second signal on the basis of a second output of the second photodiode; and a first layer that selectively transmits light of a first wavelength region and spatially covers a light-receiving surface of the first photodiode, and a second layer that transmits light of a second wavelength region different from the first wavelength region and spatially covers a light-receiving surface of the second photodiode on the light-receiving side;

the first and second photodiodes having been formed under identical semiconductor manufacturing process conditions inside the semiconductor substrate and each comprising a first semiconductor layer region of a first conductive type, a second semiconductor layer region of a second conductive type that differs in polarity from the first conductive type and is provided on the first semiconductor layer region, and a third semiconductor layer region of the first conductive type provided on the second semiconductor layer region, the second and third semiconductor layer regions forming a semiconductor junction;

the first semiconductor layer region containing semiconductor impurities with a concentration distributed in a layer thickness direction providing a position of a maximum concentration in the distribution;

the third semiconductor layer region containing semiconductor impurities with a concentration distributed in a layer thickness direction providing a position of a maximum concentration in the distribution;

the position of the maximum concentration in the third semiconductor layer region being provided in a layer region between the incident side surface and a depth position at which light absorptions of UV-A and UV-B light is zero or effectively zero, wherein the concentration of the impurities at the maximum concentration position of the third semiconductor layer is at least $1 \times 10^{19}/cm^3$.

8. The solid-state light-receiving device for ultraviolet light according to claim 7, wherein the first layer and the second layer contain silicon and hydrogen, and at least one element selected from the group consisting of nitrogen, oxygen, and carbon, and the second layer contains hydrogen in an amount less than an amount of hydrogen in the first layer.

9. An electronic device comprising the solid-state light-receiving device for ultraviolet light according to claim 8.

10. The electronic device according to claim 9, further comprising a communication function.

11. An electronic device comprising the solid-state light-receiving device for ultraviolet light according to claim 7.

12. The electronic device according to claim 11, further comprising a communication function.

13. A solid-state light-receiving device for ultraviolet light, comprising:

a semiconductor substrate containing silicon as a main component, a first photodiode and a second photodiode disposed inside the semiconductor substrate so as to not effectively overlap three-dimensionally, and a differential signal processor adapted to receive a first signal on the basis of an output of the first photodiode and a second signal on the basis of an output of the second photodiode; and a first layer that selectively transmits light of a first wavelength region and spatially covers a light-receiving surface of the first photodiode, and a second layer that transmits light of a second wavelength region different from the first wavelength region and spatially covers a light-receiving surface of the second photodiode on the light-receiving side;

the first and second photodiodes having been formed under identical semiconductor manufacturing process conditions inside the semiconductor substrate and each comprising a first semiconductor layer region of a first conductive type, a second semiconductor layer region of a second conductive type that differs in polarity from the first conductive type and which is provided on the first semiconductor layer region, and a third semiconductor layer region of the first conductive type provided on the second semiconductor layer region, the second and third semiconductor layer regions forming a semiconductor junction;

the first semiconductor layer region containing semiconductor impurities with a concentration distributed in a layer thickness direction providing a position of a maximum concentration;

the third semiconductor layer region containing semiconductor impurities with a concentration distributed in a layer thickness direction providing a position of a maximum concentration, the position of maximum concentration in the third semiconductor layer being provided in a layer region between the incident side surface and a depth position at which light absorption of UV-A and UV-B light is zero or effectively zero, wherein the concentration of the impurities at the maximum concentration position in the third semiconductor layer region is at least $1 \times 10^{19}/cm^3$ where all or substantially all lines of electric force that occur by a fixed charge produced by irradiation of far ultraviolet light terminate.

14. The solid-state light-receiving device for ultraviolet light according to claim 13, wherein the first layer and the second layer contain silicon and hydrogen, and at least one element selected from a group consisting of nitrogen, oxygen, and carbon, and the second layer contains hydrogen in an amount less than an amount of hydrogen in the first layer.

15. An electronic device comprising the solid-state light-receiving device for ultraviolet light according to claim 14.

16. The electronic device according to claim 15, further comprising a communication function.

17. An electronic device comprising the solid-state light-receiving device for ultraviolet light according to claim 13.

18. The electronic device according to claim 17, further comprising a communication function.

19. An ultraviolet light measuring method, comprising the steps of:

(1) obtaining solid-state light-receiving device for ultraviolet light, comprising:

a semiconductor substrate containing silicon as a main component, a first photodiode and a second photodiode disposed inside the semiconductor substrate so as to not effectively overlap three-dimensionally, and a differential signal processor adapted to receive a first signal on the basis of a first output of the first photodiode and a second signal on the basis of a second output of the second photodiode; and a first layer that selectively transmits light of a first wavelength region and spatially covers a light-receiving surface of the first photodiode, and a second layer that transmits light of a second wavelength region different from the first wavelength region and spatially covers a light-receiving surface of the second photodiode on the light-receiving side;

the first and second photodiodes having been formed under identical semiconductor manufacturing process conditions inside the semiconductor substrate and each comprising a first semiconductor layer region of a first conductive type, a second semiconductor layer region of a second conductive type that differs in polarity from the first conductive type and is provided on the first semiconductor layer region, and a third semiconductor layer region of the first conductive type provided on the second semiconductor layer region, the second and third semiconductor layer regions forming a semiconductor junction;

the first semiconductor layer region containing semiconductor impurities with a concentration distributed in a layer thickness direction providing a position of a maximum concentration in the distribution;

the third semiconductor layer region containing semiconductor impurities with a concentration distributed in a layer thickness direction providing a position of a maximum concentration in the distribution;

the position of the maximum concentration in the third semiconductor layer region being provided in a layer region between the incident side surface and a depth position at which light absorptions of UV-A and UV-B light is zero or effectively zero, wherein the concentration of the impurities at the maximum concentration position of the third semiconductor layer is at least $1 \times 10^{19}/cm^3$;

(2) irradiating ultraviolet light onto the first photodiode and the second photodiode to obtain outputs from each of the photodiodes;

(3) inputting a first signal on the basis of the output of the first photodiode and a second signal on the basis of the output of the second photodiode to a differential signal processor to form a differential signal; and (4) determining an amount of irradiation of ultraviolet light based on the differential signal.

20. An ultraviolet light measuring method, comprising the steps of:

(1) obtaining preparing solid-state light-receiving device for ultraviolet light comprising:

a semiconductor substrate containing silicon as a main component, a first photodiode and a second photodiode disposed inside the semiconductor substrate so as to not effectively overlap three-dimensionally, and a differential signal processor adapted to receive a first signal on the basis of an output of the first photodiode and a second signal on the basis of an output of the second photodiode; and a first layer that selectively transmits light of a first wavelength region and spatially covers a light-receiving surface of the first photodiode, and a second layer that transmits light of a second wavelength region different from the first wavelength region and spatially covers a light-receiving surface of the second photodiode on the light-receiving side;

the first and second photodiodes having been formed under identical semiconductor manufacturing process conditions inside the semiconductor substrate and each comprising a first semiconductor layer region of a first conductive type, a second semiconductor layer region of a second conductive type that differs in polarity from the first conductive type and which is provided on the first semiconductor layer region, and a third semiconductor layer region of the first conductive type provided on the second semiconductor layer region, the second and third semiconductor layer regions forming a semiconductor junction;

the first semiconductor layer region containing semiconductor impurities with a concentration distributed in a layer thickness direction providing a position of a maximum concentration;

the third semiconductor layer region containing semiconductor impurities with a concentration distributed in a layer thickness direction providing a position of a maximum concentration, the position of maximum concentration in the third semiconductor layer being provided in a layer region between the incident side surface and a depth position at which light absorption of UV-A and UV-B light is zero or effectively zero, wherein the concentration of the impurities at the maximum concentration position in the third semiconductor layer region is at least $1 \times 10^{19}/cm^3$ where all or substantially all lines of electric force that occur by a fixed charge produced by irradiation of far ultraviolet light terminate;

(2) irradiating ultraviolet light onto the first photodiode and the second photodiode to obtain outputs from each of the photodiodes;

(3) inputting a first signal on the basis of the output of the first photodiode and a second signal on the basis of the output of the second photodiode to a differential signal processor to form a differential signal; and (4) determining an amount of irradiation of ultraviolet light based on the differential signal.

* * * * *